(12) United States Patent
Pillarisetty et al.

(10) Patent No.: US 11,101,376 B2
(45) Date of Patent: Aug. 24, 2021

(54) NON-PLANAR TRANSITION METAL DICHALCOGENIDE DEVICES

(71) Applicant: Intel Corporation, Santa Clara, CA (US)

(72) Inventors: Ravi Pillarisetty, Portland, OR (US); Abhishek Sharma, Hillsboro, OR (US); Van H. Le, Portland, OR (US); Gilbert Dewey, Hillsboro, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/613,751

(22) PCT Filed: Jun. 29, 2017

(86) PCT No.: PCT/US2017/040030
§ 371 (c)(1),
(2) Date: Nov. 14, 2019

(87) PCT Pub. No.: WO2019/005074
PCT Pub. Date: Jan. 3, 2019

(65) Prior Publication Data
US 2020/0083359 A1   Mar. 12, 2020

(51) Int. Cl.
*H01L 31/00* (2006.01)
*H01L 29/76* (2006.01)
(Continued)

(52) U.S. Cl.
CPC ...... *H01L 29/7606* (2013.01); *H01L 21/0243* (2013.01); *H01L 21/0259* (2013.01);
(Continued)

(58) Field of Classification Search
CPC .......... H01L 29/7606; H01L 29/78606; H01L 29/78681; H01L 29/78696; H01L 21/0243; H01L 21/02488; H01L 21/02513; H01L 21/02568; H01L 21/0259; H01L 21/02664; H01L 21/823431; H01L 21/823821;
(Continued)

(56) References Cited

U.S. PATENT DOCUMENTS

2015/0364592 A1* 12/2015 van Dal .............. H01L 29/1054
257/29
2016/0343805 A1   11/2016 Lee et al.
(Continued)

FOREIGN PATENT DOCUMENTS

KR   1020140037702   3/2014

OTHER PUBLICATIONS

International Search Report and Written Opinion for International Patent Application No. PCT/US17/40030, dated Mar. 15, 2018.
(Continued)

*Primary Examiner* — Calvin Y Choi
(74) *Attorney, Agent, or Firm* — Green, Howard & Mughal LLP

(57) ABSTRACT

Embodiments related to transistors having one or more non-planar transition metal dichalcogenide cladding layers, integrated circuits and systems incorporating such transistors, and methods for fabricating them are discussed.

25 Claims, 11 Drawing Sheets

(51) Int. Cl.
*H01L 21/02* (2006.01)
*H01L 29/78* (2006.01)
*H01L 29/786* (2006.01)

(52) U.S. Cl.
CPC .. *H01L 21/02488* (2013.01); *H01L 21/02513* (2013.01); *H01L 21/02568* (2013.01); *H01L 21/02664* (2013.01); *H01L 29/785* (2013.01); *H01L 29/78606* (2013.01); *H01L 29/78681* (2013.01); *H01L 29/78696* (2013.01)

(58) Field of Classification Search
CPC ............... H01L 21/845; H01L 27/0886; H01L 27/0924; H01L 27/10826; H01L 27/10879; H01L 27/1211; H01L 29/41791; H01L 29/66795–66818; H01L 29/785–7856; H01L 2029/7857–7858; H01L 2924/13067; H01L 29/04–045; H01L 29/16–1608; H01L 29/18–185; H01L 29/22–2206; H01L 29/36–365

USPC ........................................................... 257/27
See application file for complete search history.

(56) References Cited

U.S. PATENT DOCUMENTS

| | | |
|---|---|---|
| 2017/0003248 A1 | 1/2017 | Yang et al. |
| 2017/0012117 A1 | 1/2017 | Radosavljevic et al. |
| 2017/0059514 A1 | 3/2017 | Hoffman |
| 2017/0098717 A1* | 4/2017 | Yeh .................. H01L 21/8256 |
| 2019/0259699 A1* | 8/2019 | Morrow ................ H01L 23/522 |

OTHER PUBLICATIONS

International Preliminary Report on Patentability notified Jan. 9, 2020 for PCT Patent Application No. PCT/US217/040030.

* cited by examiner

US 11,101,376 B2

NON-PLANAR TRANSITION METAL DICHALCOGENIDE DEVICES

CLAIM OF PRIORITY

This Application is a National Stage Entry of, and claims priority to, PCT Application No. PCT/US17/40030, filed on Jun. 29, 2017 and titled "NON-PLANAR TRANSITION METAL DICHALCOGENIDE DEVICES", which is incorporated by reference in its entirety for all purposes.

TECHNICAL FIELD

Embodiments of the invention generally relate to transistor devices and more particularly relate to transition metal dichalcogenide transistor devices with increased, drive current and increased device density, related devices, and manufacturing techniques.

BACKGROUND

Demand for integrated circuits (ICs) in electronic applications has motivated greater levels of semiconductor device integration and research into more advanced devices. Many advanced semiconductor devices in development leverage non-silicon semiconductor materials, a subset of which have hexagonal crystallinity. One class of those materials is transition metal dichalcogenides (TMD or TMDC). TMDCs display semiconductor properties as a sheet of $MX_2$, where M is a transition metal atom and X is a chalcogen atom. In the monolayered crystalline sheet, one layer of M atoms is disposed between two layers of X atoms. TMDC materials are of significant interest as a basis for highly-scaled integrated circuitry (IC), in part because of the thin active layers possible. For example, TMDC-channeled transistors have excellent short channel properties and gate electrode control. TMDC materials have been found to have a bandgap (direct) suitable for transistors and it has been shown that TMDC materials have good electron and hole mobility.

As such, there is a continual demand for improved integrated circuit devices such as improved transition metal dichalcogenide transistor devices. It is with respect to these and other considerations that the present improvements have been needed.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Furthermore, where considered appropriate, reference labels have been repeated among the figures to indicate corresponding or analogous elements. In the figures:

FIGS. 6A, 69, 6C, 6D, and 6E are cross-sectional views of example transistor device structures as particular fabrication operations are performed;

DETAILED DESCRIPTION

Figure 1A:
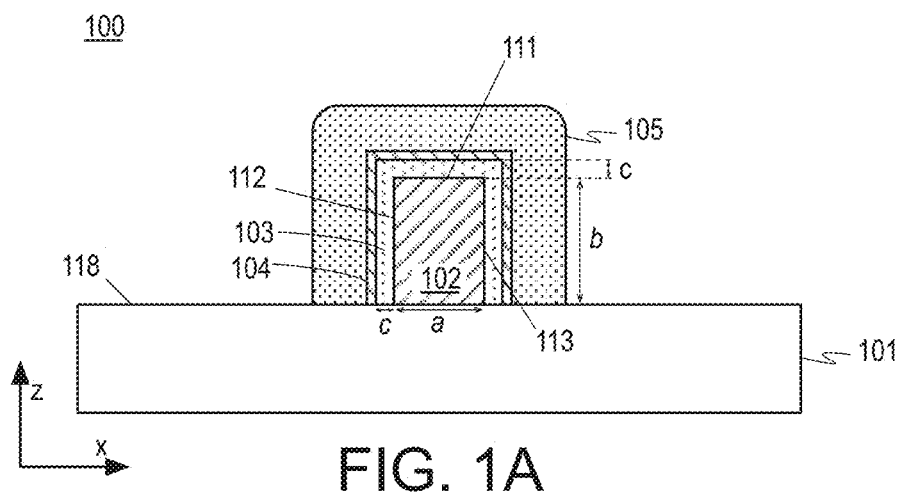
FIG. 1A is a cross-sectional view of an example transistor device structure.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not specified to be mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. Furthermore, the terms "substantially," "close," "approximately," "near," and "about," generally refer to being within +/−10% of a target value. The term layer as used herein may include a single material or multiple materials.

Transistors, integrated circuits, devices, apparatuses, computing platforms, and methods are described below related to transistors having one or more non-planar transition metal dichalcogenide cladding layers.

As described above, it may be advantageous to provide semiconductor devices such as transistors that include transition metal dichalcogenide (TMD or TMDC) monolayers. As used herein, a transition metal dichalcogenide layer (or cladding layer or the like) includes a transition metal layer between two chalcogen layers. Furthermore, multiple transition metal dichalcogenide layers include multiple layers each including a transition metal layer between two chalcogen layers. Such transition metal dichalcogenide layers exhibit semiconductor properties as a sheet or layer of a transition metal layer between two chalcogen layers (e.g., of $MX_2$, where M is a transition metal atom and X is a chalcogen atom). In a single transition metal dichalcogenide layer (e.g., a transition metal dichalcogenide monolayer), one layer of M atoms is between (e.g., disposed or sandwiched between) two layers of X atoms. Such transition metal dichalcogenide layers are thin, have a bandgap (direct) suitable for transistor applications, have excellent short channel properties and gate electrode control, and good electron and hole mobility.

In some embodiments discussed herein, a transistor includes one or more transition metal dichalcogenide cladding layers over a non-planar body such that the transition metal dichalcogenide cladding layer(s) substantially conform to the shape of the non-planar body. As used herein, the term substantially conformal or similar terms indicate the transition metal dichalcogenide cladding layer(s) have a shape or topography similar to or the same as the underlying topography of the transition metal dichalcogenide cladding layer(s), which may be provided by a non-planar body or bodies, a substrate surface, or the like. The non-planar body may have any suitable cross sectional shape such as rectangular shape such that the non-planar body has a three dimensional shape of a fin. The transistor further includes source and drain electrodes and a gate electrode therebetween such that the gate electrode and source and drain electrodes are electrically coupled to the transition metal dichalcogenide cladding layer(s). Such a transistor provides transition metal dichalcogenide cladding layer(s) having a non-planar topography such that, in comparison to a planar device, the gate electrode and source and drain electrodes are coupled to greater surface areas (e.g., a channel region, a source region, and a drain region of the transition metal dichalcogenide cladding layer(s), respectively) per area of the device (e.g., area of a substrate used for the device or the like). Such non-planar devices provide for increase in drive current per unit layout area of the device.

In some embodiments, a transistor including one or more non-planar transition metal dichalcogenide cladding layers may be integrated into an apparatus or system having any suitable form factor. For example, a processor, a static random-access memory (SRAM) device, or the like may include a transistor having one or more transition metal dichalcogenide cladding layers over a non-planar body such that the transition metal dichalcogenide cladding layer(s) substantially conform to the shape of the non-planar body and source and drain electrodes and a gate electrode therebetween such that the gate electrode and source and drain electrodes are electrically coupled to the transition metal dichalcogenide cladding layer(s). Embodiments discussed herein may provide for non-planar TMD transistors, devices having non-planar TMD transistors, techniques for fabricating non-planar TMD transistors, and a non-planar integration schemes for TMD devices.

These and additional embodiments are discussed further herein with respect to the figures.

Figure 1B:
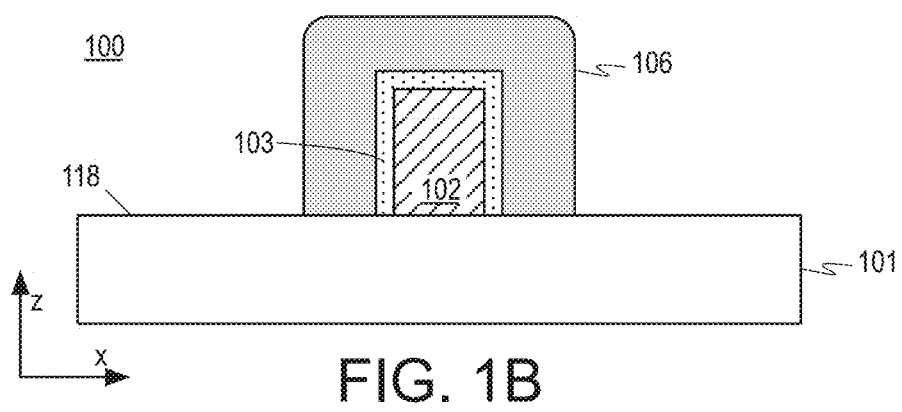
FIG. 1B is another cross-sectional view of the transistor device structure of FIG. 1A.
Figure 1C:
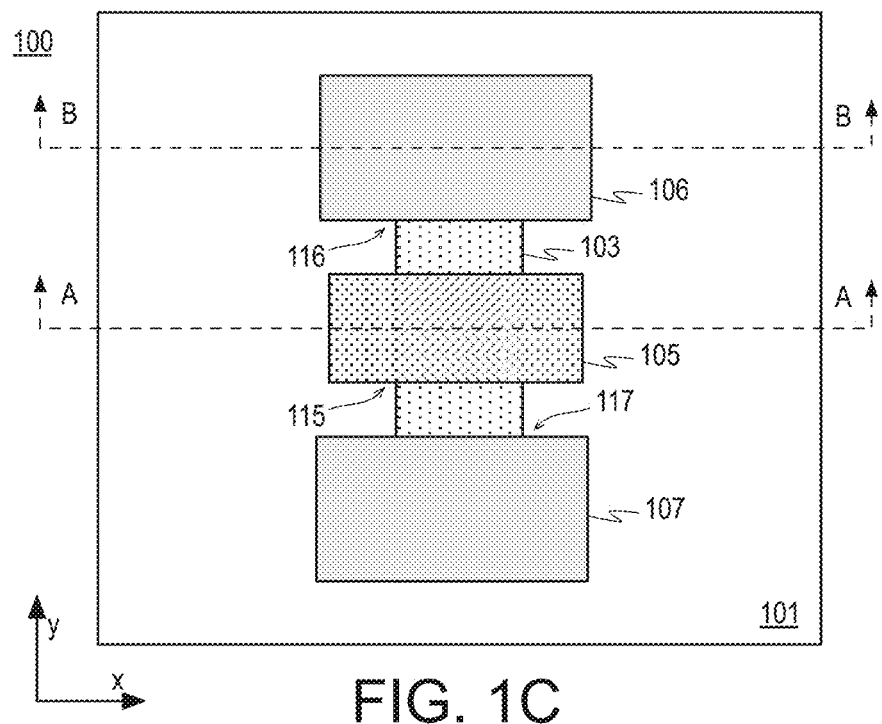
FIG. 1C is a top-down view of the transistor device structure of FIG. 1A.

FIG. 1A is a cross-sectional view of an example transistor device structure 100, FIG. 1B is another cross-sectional view of transistor device structure 100, and FIG. 1C is a top-down view of transistor device structure 100, arranged in accordance with at least some implementations of the present disclosure. As shown, FIG. 1A provides a cross-sectional view along an x-z plane at a view A-A illustrated in FIG. 1C and FIG. 1B provides a cross-sectional view along an x-z plane at a view B-B illustrated in FIG. 1C. As illustrated, the x-y plane may be in-plane, in-line, or the like with respect to a lateral direction of transistor device structure 100 and the z-direction may be perpendicular with respect to the lateral direction of transistor device structure 100. Transistor device structure 100 may be implemented as a part of any suitable integrated circuit, integrated circuit device, or the like, which may, in turn, be implemented as a part of any suitable form factor device or system, as is discussed further herein. Transistor device structure 100 may be characterized as a transistor device, a transistor, or the like.

As shown, transistor device structure 100 may include a substrate 101, a non-planar body 102, one or more transition metal dichalcogenide cladding layers 103, a gate dielectric layer 104, a gate electrode 105, a source electrode 106, and a drain electrode 107. As discussed, transition metal dichalcogenide cladding layers 103 may include a single transition metal dichalcogenide cladding layer 103 or multiple transition metal dichalcogenide cladding layers 103. The term transition metal dichalcogenide cladding layers such as with respect to transition metal dichalcogenide cladding layers 103 is used herein for the sake of clarity. However, such usage is not meant to indicate multiple transition metal dichalcogenide cladding layers are required except in those embodiments where multiple transition metal dichalcogenide cladding layers are discussed. Furthermore, as will be appreciated, the cross section at view B-B with respect to source electrode 106 illustrated in FIG. 1B may be substantially the same as a cross section at a view at or along drain electrode 107, which is not shown for the sake of brevity.

Also as shown, metal dichalcogenide cladding layers 103 may be substantially conformal to non-planar body 102 such that metal dichalcogenide cladding layers 103 have a non-planar topography. In the illustrated embodiment, transition metal dichalcogenide cladding layers 103 are on non-planar body 102. However, one or more layers or materials may be between non-planar body 102 and transition metal dichalcogenide cladding layers 103. Furthermore, transition metal dichalcogenide cladding layers 103 are over a top surface 111 of non-planar body and over sidewall surfaces 112, 113 of non-planar body 102. For example, transition metal dichalcogenide cladding layers 103 are adjacent to and covering top surface 111 in the z-direction (e.g., perpendicular with respect to a lateral surface 118 (e.g., a top surface) of substrate 101 and a lateral direction of transistor device structure 100. Furthermore, transition metal dichalcogenide cladding layers 103 are over, adjacent to, and covering sidewall surfaces 112, 113 in the x-direction (e.g., in-line with lateral surface 118 and the lateral direction of transistor device structure 100).

Furthermore, as shown, transition metal dichalcogenide cladding layers 103 is non-planar such that along a lateral direction of transistor device structure 100 (e.g., in the x-direction), transition metal dichalcogenide cladding layers 103 are discontinuous (e.g., non-planar body 102 is between transition metal dichalcogenide cladding layers 103 along the lateral or x-direction). For example, transition metal dichalcogenide cladding layers 103, in the example of FIG. 1A, have a substantially inverted U shape.

As discussed, the topography of transition metal dichalcogenide cladding layers 103 as substantially conformal to non-planar body 102 may provide increased surface area coupling between gate electrode 105 and transition metal dichalcogenide cladding layers 103, between source electrode 106 and transition metal dichalcogenide cladding layers 103, and between drain electrode 107 and transition metal dichalcogenide cladding layers 103. Non-planar body 102 may have any suitable shape that provides for such increased surface area coupling. In the illustrated embodiment, non-planar body 102 has a substantially rectangular cross sectional shape such that top surface 111 is perpendicular with respect to sidewall surfaces 112, 113. Furthermore, in the illustrated embodiment, non-planar body 102 has a lateral width, a, that is less than its vertical height, b. In other embodiments, non-planar body 102 a substantially rectangular cross sectional shape such that lateral width, b, is greater than vertical height, b. In other embodiments, non-planar body 102 has a substantially square cross sectional shape such that lateral width, b, is about the same as vertical height, b.

In other embodiments, non-planar body 102 has a non-rectangular (or square) shape. For example, non-planar body 102 may have a trapezoidal cross sectional shape such that one or both of sidewall surfaces 112, 113 are sloped with a lateral width of non-planar body at top surface 111 (e.g., at a distal end of non-planar body 102 with respect to substrate 101) being less than a lateral width of non-planar body at substrate 101 (e.g., at a proximal end of non-planar body 102 with respect to substrate 101). In another embodiment, non-planar body 102 has a half circular or half elliptical shape such that top surface 111 and sidewall surfaces 112, 113 are at least partially rounded convex with respect to a center or non-planar body. Furthermore, as shown, transition metal dichalcogenide cladding layers 103 may have a substantially inverted. U shape along the y-z plane; however, transition metal dichalcogenide cladding layers 103 may have any shape that substantially conforms to non-planar body. In the illustrated embodiments, transition metal dichalcogenide cladding layers 103 extend to lateral surface 118 of substrate 101. In other embodiments, a gap is provided between the ends of transition metal dichalcogenide cladding layers 103 and lateral surface of substrate 101.

Non-planar body 102 may have any suitable dimensions. In an embodiment, lateral width, a, of non-planar body 102 may be in the range of about 5 to 20 nanometers. In an embodiment, lateral width, a, of non-planar body 102 may be not greater than 10 nanometers. In an embodiment, lateral width, a, of non-planar body 102 may be in the range of about 20 to 200 nanometers. As shown, lateral width, a, of non-planar body 102 may be taken at or near lateral surface 118 of substrate 118. In other embodiments, lateral width, a, of non-planar body 102 may be taken at or near top surface 111, at a midpoint between lateral surface 118 and top surface 111 or the like. Furthermore, vertical height, b, may be in the range of about 5 to 500 nanometers. In an embodiment, vertical height, b, may exceed 20 nanometers. In an embodiment, vertical height, h, is in the range of 20 to 200 nanometers. Furthermore, an aspect ratio of non-planar body 102 may be defined as a ratio, r, of vertical height, b, to lateral width, a (e.g., taken at any point of non-planar body 102 as discussed). The aspect ratio, r, of non-planar body 102 may be any suitable value, in an embodiment, the aspect ratio, r, of non-planar body 102 is in the range of 0.8 to 1.5. In an embodiment, the aspect ratio, r, of non-planar body 102 is not less than 1.5. In an embodiment, the aspect ratio, r, of non-planar body 102 is not less than 2.0. In an embodiment, the aspect ratio, r, of non-planar body 102 is in the range of 1.5 to 5.0.

As discussed, non-planar body 102 may be on (e.g., disposed on) or over substrate 101. Substrate 101 may be any suitable material or materials. In some examples, substrate 101 may include a semiconductor material such as monocrystalline silicon substrate, a silicon on insulator, or the like. In various examples, substrate 101 may include metallization interconnect layers for integrated circuits or electronic devices such as transistors, memories, capacitors, resistors, optoelectronic devices, switches, or any other active or passive electronic devices separated by an electrically insulating layer, for example, an interlayer dielectric, a trench insulation layer, or the like. In an embodiment, substrate 101 includes a layer or portion or region or the like that provides lateral surface 118. Such a layer or the like may be a dielectric layer such as silicon oxide or silicon nitride or the like and the layer may be provided on a bulk substrate material such as monocrystalline silicon or the like. Non-planar body 102 and substrate 101 (e.g., the layer or portion of substrate 101 adjacent to non-planar body 102) may be the same material or they may be different materials.

In the illustrated embodiment, non-planar body 102 and substrate 101 are non-continuous (e.g., non-planar body 102 and substrate 101 are contiguous) and include different material compositions. In an embodiment, substrate 101 includes silicon oxide or doped silicon oxide and non-planar body 102 includes one or more layers of boron nitride (e.g., boron nitride monolayers extending laterally in the x-y plane stacked in the z direction). In an embodiment, non-planar body 102 includes multiple layers of hexagonal boron nitride (HBN). In such an embodiment, a bottom monolayer of transition metal dichalcogenide cladding layers 103 may be lattice matched to a top monolayer of boron nitride of non-planar body 102. For example, a bottom monolayer of transition metal dichalcogenide cladding layers 103 may be lattice to within 1% to a top monolayer of boron nitride of non-planar body 102. Furthermore, in such an embodiment, transition metal dichalcogenide cladding layers 103 may be unstrained. In other embodiments, non-planar body 102 includes a non-lattice matched composition to deliberately induce some level of strain in transition metal dichalcogenide cladding layers 103. In an embodiment, substrate 101 includes silicon oxide or doped silicon oxide and non-planar body 102 includes silicon nitride or doped silicon nitride. In an embodiment, substrate 101 includes silicon nitride or doped silicon nitride and non-planar body 102 includes silicon oxide or doped silicon oxide. In other embodiments, non-planar body 102 and substrate 101 are continuous and include the same material. For example, non-planar body 102 and substrate 101 may include silicon oxide or doped silicon oxide, silicon nitride or doped silicon nitride, polysilicon, or any suitable material for the formation of non-planar body 102.

Furthermore, transition metal dichalcogenide cladding layers 103 are over non-planar body 102. As discussed, in some embodiments, transition metal dichalcogenide cladding layers 103 are on and conformal to non-planar body 102. In other embodiments, one or more layers or materials may be between transition metal dichalcogenide cladding layers 103 and non-planar body 102. Transition metal dichalcogenide cladding layers 103 may include any suitable material or materials such that transition metal dichalcogenide cladding layers 103 includes at least one (e.g., one or more) transition metal dichalcogenide layer having a transition metal atomic layer between two chalcogen atomic layers. The transition metal atomic layer may include any suitable transition metal atomic layer. In an embodiment, the transition metal atomic layer is a molybdenum (Mo) layer. In an embodiment, the transition metal atomic layer is a tungsten (W) layer. In an embodiment, the transition metal atomic layer is a hafnium (Hf) layer. For example, the transition metal atomic layer may include molybdenum, tungsten, or hafnium. Furthermore, the chalcogen atomic layers may include any suitable chalcogen atomic layers. In an embodiment, the chalcogen atomic layers are sulfide (S) layers. In an embodiment, the chalcogen atomic layers are selenide (S) layers. In an embodiment, the chalcogen atomic layers are telluride (Te) layers. For example, the chalcogen atomic layers may include sulfur, selenium, or tellurium.

In some embodiments, transition metal dichalcogenide cladding layers 103 includes a $MX_2$ compound that may comprise any transition metal (e.g., d-block and f-block groups of the periodic table) and any chalcogen (group VI/16 of the periodic table). In some embodiments, a transition metal dichalcogenide layer of transition metal dichalcogenide cladding layers 103 includes one of W or Mo and one of S, Se, and Te (e.g., $WS_2$, $WSe_2$, $WTe_2$, $MoS_2$, $MoSe_2$, $MoTe_2$). For example, the choice of metal and chalcogen may be based on the desired conductivity type of transition metal dichalcogenide cladding layers 103 (e.g., $WSe_2$ for p-type and $MoS_2$ for n-type). Transition metal dichalcogenide cladding layers 103 is a monocrystalline material (i.e., a crystal). In some embodiments, transition metal dichalcogenide cladding layers 103 includes one crystal monolayer (an atomic monolayer of metal atoms disposed between two atomic monolayers of chalcogen atoms). Such crystal monolayers have a film thickness (e.g., thickness, c) of less than 10 Å (1.0 nm), and for an exemplary $MoS_2$ monolayer, the film thickness is approximately 6.5 Å. In embodiments with more than one monolayer, transition metal dichalcogenide cladding layers 103 may advantageously include an odd number of monolayers (e.g., to ensure no inversion center).

Transition metal dichalcogenide cladding layers 103 may include any number of such transition metal dichalcogenide layers (monolayers) such as a single layer (e.g., a monolayer), not less than five layers (e.g., not less than five monolayers), not less than ten layers (e.g., not less than ten monolayers), not less than twenty layers (e.g., not less than twenty monolayers), or the like. For examples, transition metal dichalcogenide cladding layers 103 may include 1 to 5 monolayers, 5 to 10 monolayers, 10 to 50 monolayers, or the like. Transition metal dichalcogenide cladding layers 103 may include any suitable thickness, c. As shown, thickness, c, of transition metal dichalcogenide cladding layers 103 may be substantially the same over top surface 111 and sidewall surfaces 112, 113. In an embodiment, thickness, c, of transition metal dichalcogenide cladding layers 103 is in the range of about 5 to 8 Å (e.g., for a single monolayer). In an embodiment, thickness, c, of transition metal dichalcogenide cladding layers 103 does not exceed 10 Å. In an embodiment, thickness, c, of transition metal dichalcogenide cladding layers 103 is in the range of about 10 to 25 Å. In an embodiment, thickness, c, of transition metal dichalcogenide cladding layers 103 is in the range of about 25 to 40 Å. In an embodiment, thickness, c, of transition metal dichalcogenide cladding layers 103 is in the range of about 40 to 80 Å. In an embodiment, thickness, c, of transition metal dichalcogenide cladding layers 103 is in the range of about 80 to 150 Å.

As discussed, the non-planar topography of transition metal dichalcogenide cladding layers 103 may provide increased coupling area between transition metal dichalcogenide cladding layers 103 and gate electrode 105, between transition metal dichalcogenide cladding layers 103 and source electrode 106, and between transition metal dichalcogenide cladding layers 103 and drain electrode 107 per unit area of transistor device structure 100. For example, in contrast to a planar transistor device structure, non-planar transistor device structure 100 may add coupling to transition metal dichalcogenide cladding layers 103 adjacent sidewall surfaces 112, 113 (e.g., 2×b) in addition to coupling to a transition metal dichalcogenide cladding layers 103 planar surface analogous to top surface 111. Thereby, transistor device structure 100 may exhibit increased drive current and/or increased device density per unit area of lateral surface 118 of substrate 101.

As shown with respect to FIG. 1C, gate electrode 105 may be coupled to a region 115 of transition metal dichalcogenide cladding layers 103 (e.g., the region obscured by gate electrode 105). Region 115 may provide a channel region for transistor device structure 100 and region 115 may be characterized as a channel, a channel region, or the like regardless of whether transistor device structure 100 is in operation. Furthermore, as shown in FIG. 1A, gate dielectric layer 104 is between gate electrode 105 and transition metal dichalcogenide cladding layers 103 in region 115. As illustrated, in an embodiment, gate dielectric layer 104 is covered by gate electrode 105. In an embodiment, gate dielectric layer 104 extends beyond one or both edges of gate electrode 105. Gate dielectric layer 104 and gate electrode 105 may be any suitable material or materials. In an embodiment, gate dielectric layer 104 is boron nitride. In an embodiment, gate dielectric layer 104 is hexagonal boron nitride (HBN). In other embodiments, gate dielectric layer 104 includes one or more of hafnium oxide ($HfO_2$), aluminum oxide ($Al_2O_3$), or silicon nitride ($Si_3N_4$). In some embodiments, gate electrode 105 includes one or more of titanium (Ti), platinum (Pt), ruthenium (Ru), gold (Au), silver (Ag), molybdenum (Mo), aluminum (Al), tungsten (W), or copper (Cu).

With continued reference to FIG. 1C, as shown, source electrode 106 is coupled to a region 116 of transition metal dichalcogenide cladding layers 103 (e.g., the region obscured by source electrode 106) and drain electrode 107 is coupled to a region 117 of transition metal dichalcogenide cladding layers 103 (e.g., the region obscured by source electrode 107). Regions 116, 117 may provide source and drain regions, respectively for transistor device structure 100. Region 116 may be characterized as a source, a source region or the like and region 117 may be characterized as a drain, a drain region, or the like regardless of whether transistor device structure 100 is in operation. Source and drain electrodes 106, 107 may include any suitable material or materials. In some embodiments, source and drain electrodes 106, 107 include one or more of titanium (Ti), platinum (Pt), ruthenium (Ru), gold (Au), silver (Ag), molybdenum (Mo), aluminum (Al), tungsten (W), or copper (Cu).

Although illustrated with a single transistor device structure 100, any number of transistors, transistor devices, transistor device structures or the like may be provided and integrated into an integrated circuit device or other device. In an embodiment, an integrated circuit includes an n-type transistor device structure (e.g., having anon-planer $MoS_2$ transition metal dichalcogenide cladding layer or layers) and a p-type transistor device structure (e.g., having a non-planer $WSe_2$ transition metal dichalcogenide cladding layer or layers). Furthermore, an integrated circuit device or other device may include a field dielectric between such transistor device structures, conductive contacts to gate electrode 105, source electrode 106, and drain electrode 107, conductive interconnects to outside devices, etc.

As discussed, transistor device structure 100 (e.g., a transistor) includes one or more transition metal dichalcogenide cladding layers 103 over non-planar body 102 having top surface 111 and sidewall surfaces 112, 113 such that transition metal dichalcogenide cladding layer(s) 103 are over top surface 111 and sidewall surfaces 112, 113 of non-planar body. Transistor device structure 100 also includes source electrode 106 and drain electrode 107 coupled to regions 116, 117 of transition metal dichalcogenide cladding layer(s) 103, respectively, and gate electrode 105 between (e.g., in the y-direction) source electrode 106 and drain electrode 107 and coupled to region 115 of transition metal dichalcogenide cladding layer(s) 103. Also as discussed, non-planar body 102 may be on or over substrate 101. In an embodiment, transistor device structure 100 includes a single non-planer body 102 as illustrated in FIGS. 1A-1C. In other embodiments, a transistor device structure may include multiple non-planer bodies such that the transition metal dichalcogenide cladding layer(s) are over the multiple non-planer bodies and over a substrate in regions between the multiple non-planer bodies.

Figure 2A:
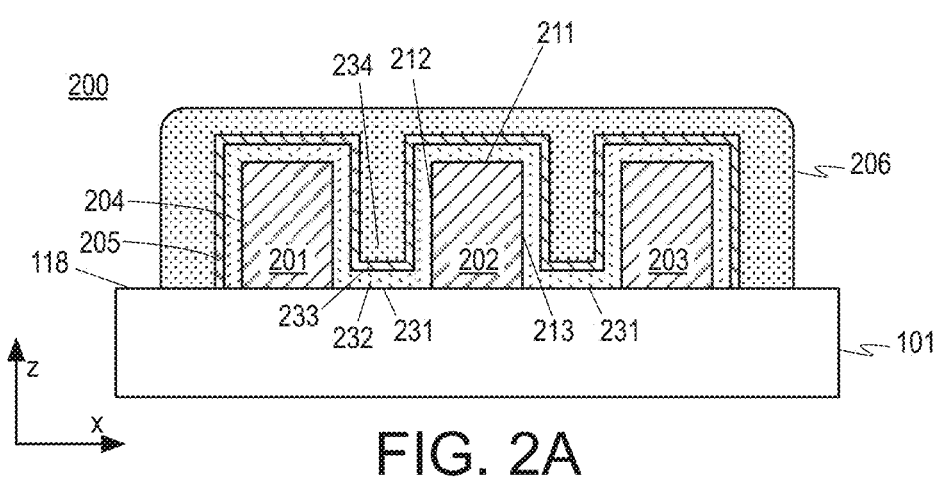
FIG. 2A is a cross-sectional view of another example transistor device structure.
Figure 2B:
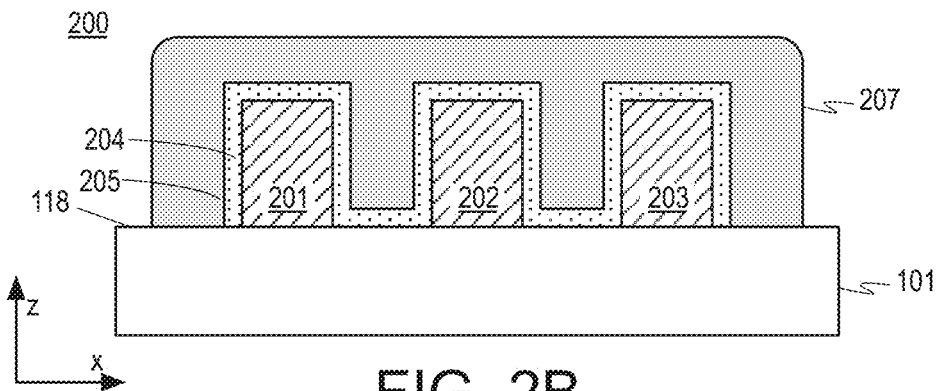
FIG. 2B is another cross-sectional view of the transistor device structure of FIG. 2A.
Figure 2C:
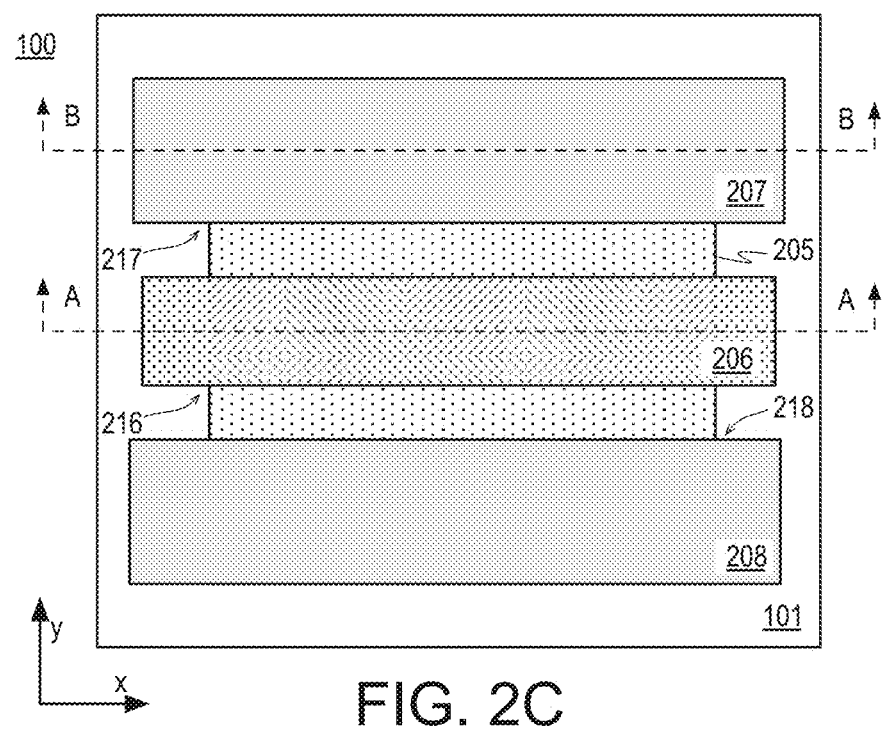
FIG. 2C is a top-down view of the transistor device structure of FIG. 2A.

FIG. 2A is a cross-sectional view of an example transistor device structure 200, FIG. 2B is another cross-sectional view of transistor device structure 200, and FIG. 2C is a top-down view of transistor device structure 200, arranged in accordance with at least some implementations of the present disclosure. As shown, FIG. 2A provides a cross-sectional view along an x-z plane at a view A-A illustrated in FIG. 2C and FIG. 2B provides a cross-sectional view along an x-z plane at a view B-B illustrated in FIG. 2C. As illustrated, the x-y plane may be in-plane, in-line, or the like with respect to a lateral direction of transistor device structure 200 and the z-direction may be perpendicular with respect to the lateral direction of transistor device structure 100. Transistor device structure 200 may be implemented as a part of any suitable integrated circuit, integrated circuit device, or the like, which may, in turn, be implemented as a part of any suitable form factor device or system, as is discussed further herein. Transistor device structure 200 may be characterized as a transistor device, a transistor, or the like.

As shown, transistor device structure 200 may include substrate 101, non-planar bodies 201, 202, 203, one or more transition metal dichalcogenide cladding layers 204, a gate dielectric layer 205, a gate electrode 206, a source electrode 207, and a drain electrode 208. Non-planar bodies 201, 202, 203 may have any characteristics (e.g., materials, dimensions, shapes, etc.) discussed with respect to non-planar body 102, transition metal dichalcogenide cladding layers 204 may have any characteristics (e.g., materials, dimensions, shapes, etc.) discussed with respect to transition metal dichalcogenide cladding layers 103, gate dielectric layer 205 may have any characteristics (e.g., materials, dimensions, shapes, etc.) discussed with respect to gate dielectric layer 104, gate electrode 206 may have any characteristics (e.g., materials, dimensions, shapes, etc.) discussed with respect to gate electrode 105, source electrode 207 may have any characteristics e.g., materials, dimensions, shapes, etc.) discussed with respect to source electrode 106, and drain electrode 208 may have any characteristics (e.g., materials, dimensions, shapes, etc.) discussed with respect to source electrode 107. Transition metal dichalcogenide cladding layers 204 may include a single transition metal dichalcogenide cladding layer 204 or multiple transition metal dichalcogenide cladding layers 204. As discussed, the term transition metal dichalcogenide cladding layers 204 is used herein for the sake of clarity. However, such usage is not meant to indicate multiple transition metal dichalcogenide cladding layers are required.

Also as shown, metal dichalcogenide cladding layers 204 may be substantially conformal to non-planar bodies 201, 202, 203, and to regions 231 of substrate 101 between non-planar bodies 201, 202, 203. In the illustrated embodiment, transition metal dichalcogenide cladding layers 103 are on non-planar bodies 201, 202, 203; however, one or more layers or materials may be between one or more of non-planar bodies 201, 202, 203 and transition metal dichalcogenide cladding layers 204. Furthermore, transition metal dichalcogenide cladding layers 204 are over top surfaces 211 non-planar bodies 201, 202, 203 and over sidewall surfaces 212, 213 of non-planar bodies 201, 202, 203. For example, transition metal dichalcogenide cladding layers 204 are adjacent to and covering top surfaces 211 in the z-direction (e.g., perpendicular with respect to lateral surface 118 of substrate 101 and a lateral direction of transistor device structure 200. Furthermore, transition metal dichalcogenide cladding layers 204 are adjacent to and covering sidewall surfaces 212, 213 in the x-direction (e.g., in-line with lateral surface 118 and the lateral direction of transistor device structure 200).

The topography of transition metal dichalcogenide cladding layers 204 as substantially conformal to non-planar bodies 201, 202, 203 may provide increased surface area coupling between gate electrode 206 and transition metal dichalcogenide cladding layers 204 as discussed herein. In addition to the additional surface area coupling caused by the vertical height of non-planar bodies 201, 202, 203 (as discussed with respect to non-planar body 102), further surface area coupling between gate electrode 206 is provided between a portion 232 of transition metal dichalcogenide cladding layers 204 between non-planar bodies 201, 202, 203 and adjacent (e.g., over) regions 231 of substrate 101. As shown, a portion 234 of gate electrode 206 and a portion 233 of gate dielectric 205 are coupled to portion 232 of transition metal dichalcogenide cladding layers 204.

Although illustrated with three non-planar bodies 201, 202, 203 having two regions 231 therebetween (e.g., between non-planar bodies 201 and 202 and between non-planar bodies 202 and 203), transistor device structure 200 may include any number of non-planar bodies 201, 202, 203 such as two, four, five, or more. Furthermore, in the illustrated embodiment, non-planar bodies 201, 202, 203 are substantially parallel to one another and run in substantially the same direction (e.g., in the y-direction). In other embodiments, non-planar bodies 201, 202, 203 are non-parallel to one another (e.g., askew). In yet other some of non-planar bodies 201, 202, 203 are perpendicular with respect to others of non-planar bodies 201, 202, 203 such that a grid pattern is provided under gate electrode 206. In an embodiment, some of non-planar bodies 201, 202, 203 (e.g., two or three) may extend in the y-direction from source electrode 207 to drain electrode 208 and through gate electrode 206 and additional non-planar bodies 201, 202, 203 (e.g., two or three) are provided perpendicular thereto and under gate electrode 206.

Non-planar bodies 201, 202, 203 may include any materials as discussed herein with respect to non-planar body 102 (e.g., boron nitride, silicon oxide, silicon nitride, etc.), any shape as discussed herein with respect to non-planar body 102 (e.g., rectangular, square, half circular or half elliptical), and any dimensions (e.g., lateral widths and vertical heights) as discussed herein with respect to non-planar body 102. As illustrated, in an embodiment, non-planar bodies 201, 202, 203 have substantially the same shape and dimensions. In other embodiments, non-planar bodies 201, 202, 203 have different shapes and/or dimensions. In an embodiment, non-planar bodies 201 and 203 are the same size and smaller than (e.g., have a smaller lateral widths and vertical heights) non-planar body 202. In the illustrated embodiment, non-planar bodies 201, 202, 203 and substrate 101 are non-continuous (e.g., non-planar body 102 and substrate 101 are contiguous) and include different material compositions. In other embodiments, non-planar bodies 201, 202, 203 and substrate 101 are continuous and include the same material.

Furthermore, transition metal dichalcogenide cladding layers 204 are over non-planar bodies 201, 202, 203 and regions 231 of substrate 101. In some embodiments, transition metal dichalcogenide cladding layers 204 are on and conformal to non-planar bodies 201, 202, 203 and regions 231 of substrate 101 while, in other embodiments, one or more layers or materials may be between transition metal dichalcogenide cladding layers 204 and one or more of non-planar bodies 201, 202, 203 and regions 231 of substrate 101. Transition metal dichalcogenide cladding layers 204 may include any suitable material or materials and thicknesses discussed herein with respect to transition metal dichalcogenide cladding layers 103.

As shown with respect to FIG. 2C, gate electrode 206 may be coupled to a region 216 of transition metal dichalcogenide cladding layers 204 (e.g., the region obscured by gate electrode 206). Region 216 may provide a channel region for transistor device structure 200 and region 216 may be characterized as a channel, a channel region, or the like regardless of whether transistor device structure 200 is in operation. Furthermore, as shown in FIG. 1A, gate dielectric layer 205 is between gate electrode 206 and transition metal dichalcogenide cladding layers 204 in region 216. As illustrated, in an embodiment, gate dielectric layer 205 is covered by gate electrode 206. In an embodiment, gate dielectric layer 205 extends beyond one or both edges of gate electrode 206. Gate dielectric layer 205 and gate electrode 205 may be any suitable material or materials such as those discussed with respect to gate dielectric layer 104 and gate electrode 105. Returning to FIG. 2C, as shown, source electrode 207 is coupled to a region 217 of transition metal dichalcogenide cladding layers 204 (e.g., the region obscured by source electrode 207) and drain electrode 208 is coupled to a region 118 of transition metal dichalcogenide cladding layers 204 (e.g., the region obscured by drain electrode 208). Regions 217, 218 may provide source and drain regions, respectively for transistor device structure 200. Region 217 may be characterized as a source, a source region or the like and region 218 may be characterized as a drain, a drain region, or the like regardless of whether transistor device structure 200 is in operation. Source and drain electrodes 207, 208 may include any suitable material or materials such as those discussed herein with respect to source and drain electrodes 106, 107.

Although illustrated with a single transistor device structure 200, any number of transistors, transistor devices, transistor device structures or the like may be provided and integrated into an integrated circuit device or other device. In an embodiment, an integrated circuit includes an n-type transistor device structure (e.g., having a non-planer $MoS_2$ transition metal dichalcogenide cladding layer or layers) and a p-type transistor device structure (e.g., having a non-planer $WSe_2$ transition metal dichalcogenide cladding layer or layers). Furthermore, an integrated circuit device or other device may include a field dielectric between such transistor device structures, conductive contacts to gate electrode 206, source electrode 207, and drain electrode 208, conductive interconnects to outside devices, etc. Furthermore, an integrated circuit device or other device may include any combination of transistor device structure 100 and transistor device structure 200 or any other suitable transistor device structures discussed herein.

Figure 3:
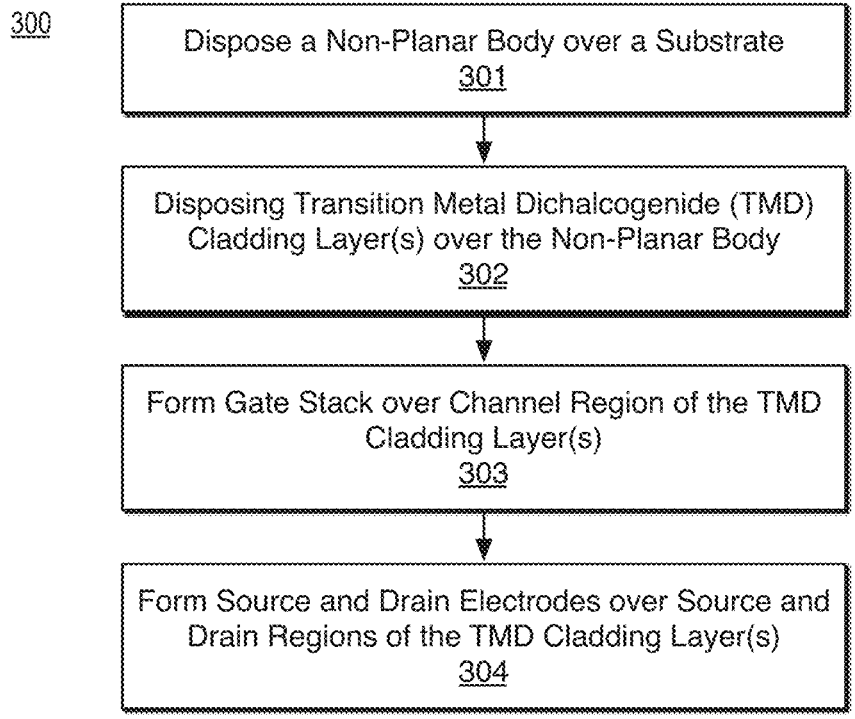
FIG. 3 is a flow diagram illustrating an example process for fabricating transistor device structures.

FIG. 3 is a flow diagram illustrating an example process 300 for fabricating transistor device structures, arranged in accordance with at least some implementations of the present disclosure. For example, process 300 may be implemented to fabricate transistor device structure 100 and/or transistor device structure 200 as discussed herein. In the illustrated implementation, process 300 may include one or more operations as illustrated by operations 301-304. However, embodiments herein may include additional operations, certain operations being omitted, or operations being performed out of the order provided. In an embodiment, process 300 may fabricate transistor device structures as discussed further herein with respect to FIGS. 4A-4D, 5A-5F, 6A-6E, 7A-7C, and 8.

Process 300 may begin at operation 301, where a substrate is received for processing and one or more non-planar bodies are disposed or formed over the substrate. The substrate may include any suitable substrate in any suitable form factor. For example, the substrate may be a silicon wafer, a monocrystalline silicon substrate, a silicon on insulator, or the like. The substrate may include metallization interconnect layers for integrated circuits or electronic devices such as transistors, memories, capacitors, resistors, optoelectronic devices, switches, or any other active or passive electronic devices separated by an electrically insulating layer, for example, an interlayer dielectric, a trench insulation layer, or the like. In an embodiment, substrate 101 may be received and processed as discussed with respect to FIG. 4A.

The one or more non-planar bodies may be disposed or formed over the substrate using any suitable technique or techniques. In an embodiment, a non-planar body having a top surface and sidewall surfaces as discussed with respect to non-planar body 102 and/or non-planar bodies 201, 202, 203 are formed over substrate 101. In an embodiment, forming the one or more non-planar bodies includes depositing a layer over the substrate and patterning the layer using photolithography and etch techniques to form the one or more non-planar bodies. For example, the non-planar bodies may be formed as discussed with respect to FIGS. 4B-4D. In an embodiment, a layer or portion of the substrate is patterned to form the one or more non-planar bodies.

Processing may continue at operation 302, where one or more transition metal dichalcogenide cladding layers are disposed over the one or more non-planar bodies. The one or more transition metal dichalcogenide cladding layers (e.g., a monolayer or multiple monolayers) may be disposed or formed over the one or more non-planar bodies using any suitable technique or techniques.

In an embodiment, disposing the transition metal dichalcogenide cladding layers over the one or more non-planar bodies includes forming a transition metal dichalcogenide layer sheet on a second substrate (e.g., a carrier substrate), contacting the transition metal dichalcogenide layer sheet with the non-planar bodies formed at operation 301, separating the second substrate from the transition metal dichalcogenide layer sheet (e.g., using cleaving and/or grind operations), annealing the transition metal dichalcogenide layer sheet to one or more non-planar bodies, and patterning the annealed transition metal dichalcogenide layer sheet to form the transition metal dichalcogenide cladding layers. For example, the transition metal dichalcogenide cladding layers may be formed as discussed with respect to FIGS. 5A-5F.

In an embodiment, similar techniques may be used to form the transition metal dichalcogenide cladding layers and a gate dielectric layer. For example, in an embodiment, disposing the transition metal dichalcogenide cladding layers over the one or more non-planar bodies includes forming a dielectric layer sheet (e.g., a boron nitride sheet) on a second substrate (e.g., a carrier substrate), forming a transition metal dichalcogenide layer sheet on the dielectric layer sheet, contacting the transition metal dichalcogenide layer sheet with the non-planar bodies formed at operation 301, separating the second substrate from the dielectric layer sheet (e.g., using cleaving and/or grind operations), annealing the transition metal dichalcogenide layer sheet and the dielectric layer sheet to the one or more non-planar bodies, and patterning the annealed transition metal dichalcogenide layer sheet and the annealed dielectric layer sheet to form the transition metal dichalcogenide cladding layers and the gate dielectric layer. For example, the transition metal dichalcogenide cladding layers may be formed as discussed with respect to FIGS. 6A-6E.

In another embodiment, disposing the transition metal dichalcogenide cladding layers over the non-planar body includes depositing a conformal transition metal dichalcogenide layer (e.g., a crystalline, amorphous, or polycrystalline conformal transition metal dichalcogenide layer having a composition of transition metal atoms and chalcogen atoms at a ratio of about 1:2) over the non-planar body and the substrate, optionally annealing the conformal transition metal dichalcogenide layer to form a conformal crystalline transition metal dichalcogenide layer (e.g., using a boron nitride crystal of the non-planar body as a seed crystal in embodiments where the conformal transition metal dichalcogenide layer is amorphous or polycrystalline), and patterning the conformal crystalline transition metal dichalcogenide layer to remove portions of the conformal transition metal dichalcogenide layer over the substrate to form the transition metal dichalcogenide cladding layers over the one or more non-planar bodies. For example, the transition metal dichalcogenide cladding layers may be formed as discussed with respect to FIGS. 7A-7E.

In an embodiment, the one or more non-planar bodies have a different composition than the composition of the substrate (e.g., a portion of the substrate adjacent to the non-planar bodies) and disposing the transition metal dichalcogenide cladding layers over the non-planar body includes selectively disposing the transition metal dichalcogenide cladding layers (e.g., based on the composition difference) over the non-planar body while leaving a region of the substrate exposed. In an embodiment, the non-planar bodies include one or more layers of crystalline boron nitride, the substrate (e.g., a portion of the substrate adjacent to the non-planar bodies) is an amorphous dielectric material, and selectively disposing the transition metal dichalcogenide cladding layers includes a first selective epitaxial growth of a first crystalline chalcogenide layer over the crystalline boron nitride, a second selective epitaxial growth of a crystalline transition metal layer over the first crystalline chalcogenide layer, and a third selective epitaxial growth of a second crystalline chalcogenide layer over the crystalline transition metal layer. For example, the selective growths may be performed using chemical vapor deposition, atomic layer deposition, and/or epitaxial growth techniques. For example, the transition metal dichalcogenide cladding layers may be formed as discussed with respect to FIG. 8.

Processing may continue at operation 303, where a gate dielectric and a gate electrode (e.g., a gate stack) may be formed over a channel region of the transition metal dichalcogenide cladding layers. The gate dielectric and gate electrode may be formed using any suitable technique or techniques. In an embodiment, a gate dielectric layer and a gate electrode layer may be formed over the (patterned) transition metal dichalcogenide cladding layers and the gate dielectric layer and the gate electrode layer may be patterned using lithography and etch techniques. In an embodiment, a dielectric layer or the like may be patterned to form an opening the gate dielectric and gate electrode may be formed in the patterned opening. As discussed, in an embodiment, the gate dielectric was formed at operation 302 (e.g., by forming a gate dielectric sheet on a carrier substrate, transferring the gate dielectric sheet such that it is disposed over the transition metal dichalcogenide cladding layers and the non-planar bodies, and patterning the gate dielectric sheet to form the gate dielectric layer). In such an embodiment, only a gate electrode may be formed at operation 303. For example, such techniques may be used to form gate dielectric 104 and gate electrode 105 and/or gate dielectric 205 and gate electrode 206.

Processing may continue at operation 304, where source and drain electrodes may be formed over source and drain regions of the transition metal dichalcogenide cladding layers. The source and drain electrodes may be formed using any suitable technique or techniques. In an embodiment, an electrode layer may be formed over the (patterned) transition metal dichalcogenide cladding layers and the electrode layer may be patterned using lithography and etch techniques. In an embodiment, a dielectric layer or the like may be patterned to form openings therein and the source and drain electrodes may be formed in the patterned openings. For example such techniques may be used to form source and drain electrodes 106, 107 and/or form source and drain electrodes 207, 208.

Process 300 may further include operations to couple the fabricated transistor device structures to other devices and/or to provide routing to external devices. For example, the gate, source, and drain electrodes may be contacted by metallized contacts or vias and higher level metallization layers and via layers may be formed over the metallized contacts or vias. The fabricated transistor device structures may be incorporated into any suitable form factor device as discussed herein.

Figure 4A:
FIGS. 4A, 4B, 4C, and 4D are cross-sectional views of example transistor device structures as particular fabrication operations are performed.

FIGS. 4A, 4B, 4C, and 4D are cross-sectional views of example transistor device structures as particular fabrication operations are performed, arranged in accordance with at least some implementations of the present disclosure. FIGS. 4A, 4B, 4C, and 4D illustrates side views of transistor device structures along the x-z plane in FIGS. 1A, 1B, 2A, and 2B. As shown in FIG. 4A, transistor device structure 401 includes substrate 101. For example, substrate 101 may 101 any substrate such as a substrate wafer received at operation 301. In some examples, substrate 101 may include a semiconductor material such as monocrystalline silicon substrate, a silicon on insulator, or the like. In various examples, substrate 101 may include metallization interconnect layers for integrated circuits or electronic devices such as transistors, memories, capacitors, resistors, optoelectronic devices, switches, or any other active or passive electronic devices separated by an electrically insulating layer, for example, an interlayer dielectric, a trench insulation layer, or the like.

Figure 4B:
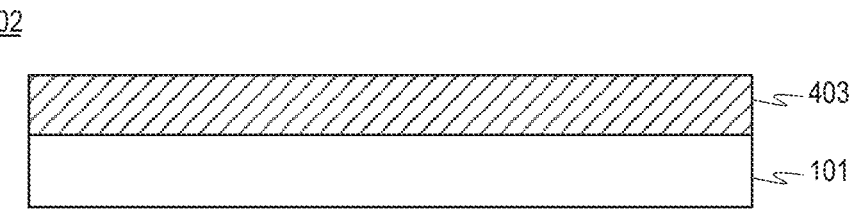

FIG. 4B illustrates a transistor device structure 402 similar to transistor device structure 401, after the disposition of a layer 403 over substrate 101. Layer 403 may include any suitable material or materials for forming non-planar bodies. For example, layer 403 may include any material or materials discussed with respect to non-planar body 102 or non-planar bodies 201, 202, 203. For example, layer 403 may include one or more of a silicon nitride or doped silicon nitride, a silicon oxide or doped silicon oxide, multiple layers of boron nitride, polysilicon, or the like.

Layer 403 may be formed using any suitable technique or techniques such as chemical vapor deposition (CVD), plasma enhanced chemical vapor deposition (PECVD), atomic layer deposition (ALD), or the like. As discussed, substrate 101 may include any suitable material or materials. In an embodiment, substrate 101 (or a top layer thereof) and layer 403 have different compositions. For example, a difference in composition between substrate 101 (or a top layer thereof) and layer 403 may aid in the selective growth or deposition of one or more transition metal dichalcogenide cladding layers as is discussed further herein. In other embodiments, substrate 101 and layer 403 may be the same material and, in such embodiments, formation of layer 403 may optionally be skipped.

Figure 4C:
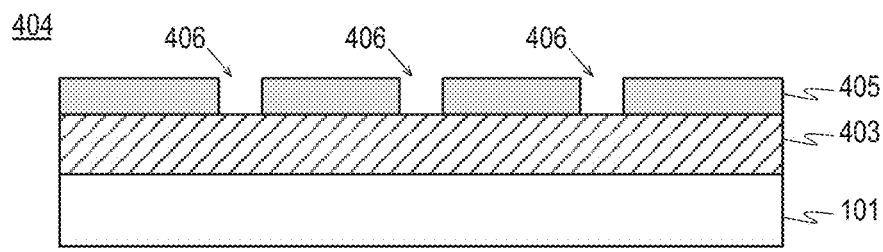

FIG. 4C illustrates a transistor device structure 404 similar to transistor device structure 402, after the formation of a patterned layer 405 over layer 403. Patterned layer 405 may include any suitable material or materials such as a photoresist and patterned layer 405 may formed using any suitable technique or techniques such as photolithography techniques. As shown, patterned layer 405 includes an openings 406 to transfer a pattern to layer 403 for the formation of non-planar bodies.

Figure 4D:
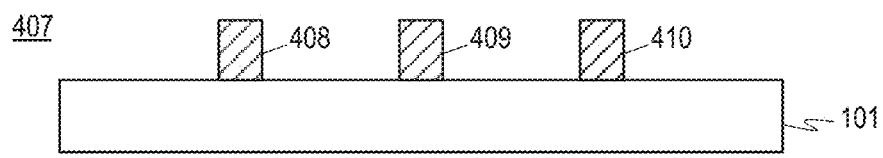

FIG. 4D illustrates a transistor device structure 407 similar to transistor device structure 404, after the formation of non-planar bodies 408, 409, 410. Non-planar bodies 408, 409, 410 may be formed using any suitable technique or techniques such as an etch of the exposed portions of layer 403 and a subsequent removal of patterned layer 405. In embodiments where layer 403 and substrate 101 are different materials, a selective etch may be performed and, in embodiments where layer 403 and substrate 101 are the material (or have no etch selectivity therebetween), a timed etch may be performed. As shown, transistor device structure 407 includes non-planar bodies 408, 409, 410, which may be any non-planar bodies discussed herein such as non-planar body 102, non-planar bodies 201, 202, 203, or the like.

FIGS. 5A, 5B, 5C, 5D, 5E, and 5F are cross-sectional views of example transistor device structures as particular fabrication operations are performed, arranged in accordance with at least some implementations of the present disclosure. FIGS. 5A, 5B, 5C, 5D, 5E, and 5F illustrate side views of transistor device structures along the x-z plane as illustrated and discussed herein.

Figure 5A:
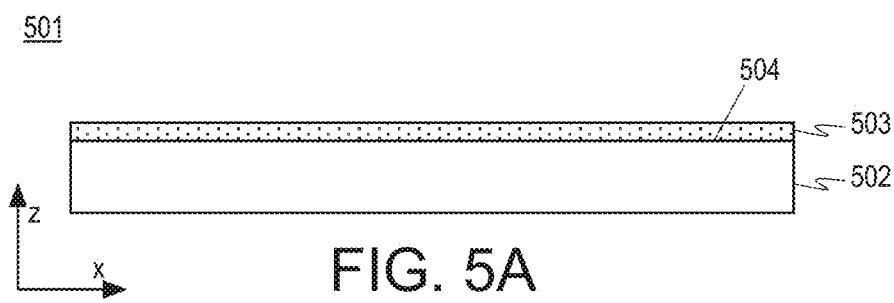
FIGS. 5A, 5B, 5C, 5D, 5E, and 5F are cross-sectional views of example transistor device structures as particular fabrication operations are performed.

As shown in FIG. 5A, transistor device structure 501 includes a transition metal dichalcogenide layer sheet 503 formed over a carrier substrate 502. Carrier substrate 502 may include any suitable carrier substrate for the formation of and subsequent separation from transition metal dichalcogenide layer sheet 503. For example, carrier substrate 602 may be a monocrystalline silicon substrate, a silicon on insulator substrate, or the like. In an embodiment, a surface 504 (e.g., a top surface for the formation of transition metal dichalcogenide layer sheet 503) may include a coating or layer that promotes the formation of transition metal dichalcogenide layer sheet 503 and/or promotes the subsequent separation from transition metal dichalcogenide layer sheet 503. For example, a crystalline III-N layer may be formed on surface 504 (e.g., a boron nitride layer, an aluminum nitride layer, a gallium nitride layer, or an indium nitride layer) may promote the formation of transition metal dichalcogenide layer sheet 503 via lattice matching.

Transition metal dichalcogenide layer sheet 503 may include any number of transition metal dichalcogenide monolayers of any suitable materials as discussed herein with respect to transition metal dichalcogenide cladding layers 103 and/or transition metal dichalcogenide cladding layers 204. Transition metal dichalcogenide layer sheet 503 may be characterized as a transition metal dichalcogenide layers sheet, a sheet of transition metal dichalcogenide layers, or the like. For example, transition metal dichalcogenide layer sheet 503 may include any number of $MoSe_2$ layers, any number of $MoS_2$ layers, any number of $WSe_2$ layers, any number of $WS_2$ layers, or the like such that each monolayer includes a transition metal (e.g., Mo or W or the like) layer between two chalcogen layers (e.g., S or Se or the like). Furthermore, transition metal dichalcogenide layer sheet 503 may be formed using any suitable technique or techniques. In an embodiment, transition metal dichalcogenide layer sheet 503 is formed using chemical vapor deposition techniques. In an embodiment, transition metal dichalcogenide layer sheet 503 is formed using atomic layer deposition techniques.

Figure 5B:
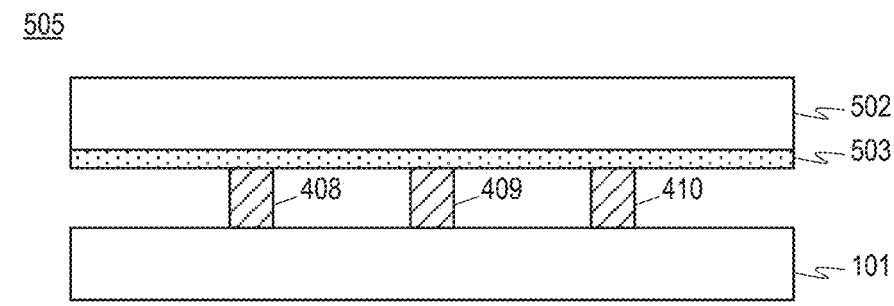

FIG. 5B illustrates a transistor device structure 505 similar to transistor device structure 501, after transistor device structure 501 is flipped and disposed on transistor device structure 407 (please refer to FIG. 4D) such that transition metal dichalcogenide layer sheet 503 contacts non-planar bodies 408, 409, 410. Transition metal dichalcogenide layer sheet 503 may be placed into contact with non-planar bodies 408, 409, 410 using any suitable technique or techniques. For example, one of transistor device structure 501 or transistor device structure 407 may be attached to a chuck (e.g., via vacuum or the like), flipped and placed adjacent to and in contact with the other of transistor device structure 501 and transistor device structure 407, which may also be fixed to a chuck (e.g., via vacuum or the like), such that transition metal dichalcogenide layer sheet 503 contacts non-planar bodies 408, 409, 410.

Figure 5C:
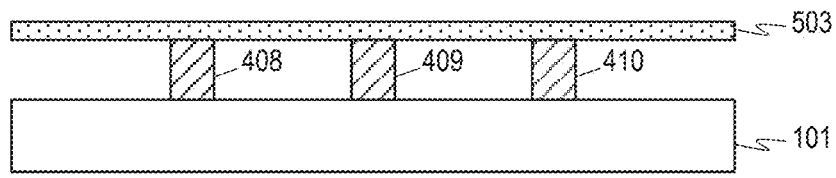

FIG. 5C illustrates a transistor device structure 506 similar to transistor device structure 505, after the separation of carrier substrate 502 from transition metal dichalcogenide layer sheet 503. Carrier substrate 502 may be separated from transition metal dichalcogenide layer sheet 503 using any suitable technique or techniques. In an embodiment, carrier substrate 502 and transition metal dichalcogenide layer sheet 503 are cleaved using laser induced cleaving or the like. In an embodiment, carrier substrate 502 is removed transition metal dichalcogenide layer sheet 503 by physical grinding or the like. In an embodiment, carrier substrate 502 includes a silicon oxide layer adjacent to transition metal dichalcogenide layer sheet 503 and a crystalline silicon layer adjacent to the silicon oxide layer. In such an embodiment, carrier substrate 502 may be removed by cleaving the silicon oxide layer and crystalline silicon interface (leaving the silicon oxide layer on transition metal dichalcogenide layer sheet 503) and subsequently removing the silicon oxide layer via etch processing.

Figure 5D:
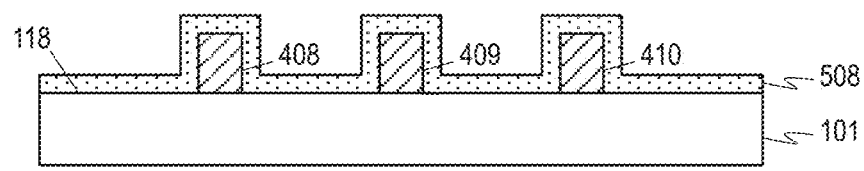

FIG. 5D illustrates a transistor device structure 507 similar to transistor device structure 506, after the annealing of transition metal dichalcogenide layer sheet 503 to form a conformal crystalline transition metal dichalcogenide layer 508. The annealing to form conformal crystalline transition metal dichalcogenide layer 508 may be performed using any suitable technique or techniques. In an embodiment, the anneal is performed with a maximum anneal temperature in the range of 400° C. to 500° C. In an embodiment, the anneal is performed with a maximum anneal temperature in the range of 500° C. to 600° C. In an embodiment, the anneal is performed with a maximum anneal temperature in the range of 600° C. to 800° C. Furthermore, the anneal may be performed for any suitable duration such as a duration in the range of 1 minute to 5 minutes, 5 minutes to 15 minutes, 15 minutes to 1 hour, or the like.

As shown, conformal crystalline transition metal dichalcogenide layer 508 is conformal to non-planar bodies 408, 409, 410 and exposed portions of lateral surface 118 of substrate 101. Conformal crystalline transition metal dichalcogenide layer 508 may have any characteristics (e.g., materials, number of transition metal dichalcogenide monolayers, thickness, etc.) as discussed herein with respect to transition metal dichalcogenide cladding layers 103, 204, or any other transition metal dichalcogenide cladding layer(s) discussed herein. In some embodiments, the formation of conformal crystalline transition metal dichalcogenide layer 508 from transition metal dichalcogenide layer sheet 503 may be aided by transition metal dichalcogenide layer sheet 503 having been compressively strained on carrier substrate 502 such that transition metal dichalcogenide layer sheet 503 relaxes during anneal to form conformal crystalline transition metal dichalcogenide layer 508. Furthermore, the embodiments of FIGS. 5A-5F may use relatively small non-planar bodies 408, 409, 410 (e.g., having lateral widths and vertical heights not exceeding 15 nanometers) to aid in the formation of conformal crystalline transition metal dichalcogenide layer 508.

Figure 5E:
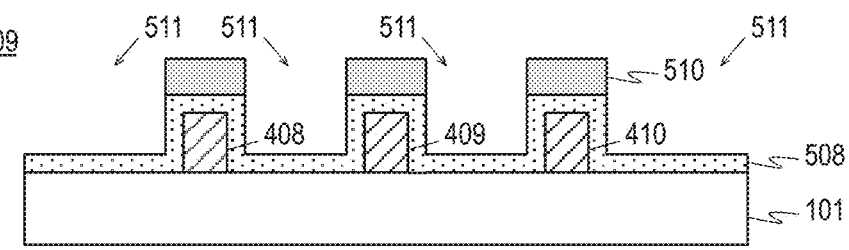

FIG. 5E illustrates a transistor device structure 509 similar to transistor device structure 507, after the formation of a patterned layer 510 over conformal crystalline transition metal dichalcogenide layer 508. Patterned layer 510 may include any suitable material or materials such as a photoresist and patterned layer 510 may formed using any suitable technique or techniques such as photolithography techniques. As shown, patterned layer 510 includes openings 511 to transfer a pattern to conformal crystalline transition metal dichalcogenide layer 508 for the formation of (patterned) transition metal dichalcogenide cladding layers as discussed herein.

Figure 5F:
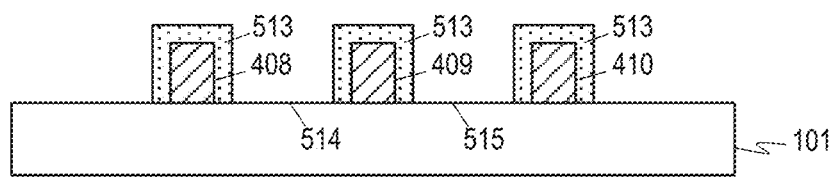

FIG. 5F illustrates a transistor device structure 512 similar to transistor device structure 509, after the formation of transition metal dichalcogenide cladding layers 513 over non-planar bodies 408, 409, 410. Transition metal dichalcogenide cladding layers 513 may be formed using any suitable technique or techniques such as an anisotropic etch of the exposed portions of conformal crystalline transition metal dichalcogenide layer 508 and a subsequent removal of patterned layer 510.

In the illustrated embodiment, separate transition metal dichalcogenide cladding layers 513 conformal to each of non-planar bodies 408, 409, 410 are provided with no portion of transition metal dichalcogenide cladding layers 513 extending between non-planar bodies 408, 409, 410 (e.g., regions 514, 515 of substrate 101 between sidewalls of transition metal dichalcogenide cladding layers 513 and between non-planar bodies 408, 409, 410 are exposed). In other embodiments, transition metal dichalcogenide cladding layers 513 may extend over one or both of regions 514, 515 as discussed herein with respect to FIGS. 2A-2C.

Subsequent processing may be performed with respect to transistor device structure 512 to form transistor device structure 100, transistor device structure 200, or the like. For example, a gate stack including a gate dielectric and a gate electrode may be formed over regions (e.g., channel regions) of transition metal dichalcogenide cladding layers 513, source and drain electrodes may be formed over other regions of transition metal dichalcogenide cladding layers 513 (e.g., source and drain regions, respectively), a field dielectric may be provided to electrically isolate such transistor device structure, the transistor device structures may be contacted by metallized contacts, and higher level metallization layers may be formed to provide electrical routing to the transistor device structures as is known in the art.

FIGS. 6A, 6B, 6C, 6D, and 6E are cross-sectional views of example transistor device structures as particular fabrication operations are performed, arranged in accordance with at least some implementations of the present disclosure.

FIGS. 6A, 6B, 6C, 6D, and 6E illustrates side views of transistor device structures along the x-z plane as illustrated and discussed herein.

Figure 6A:
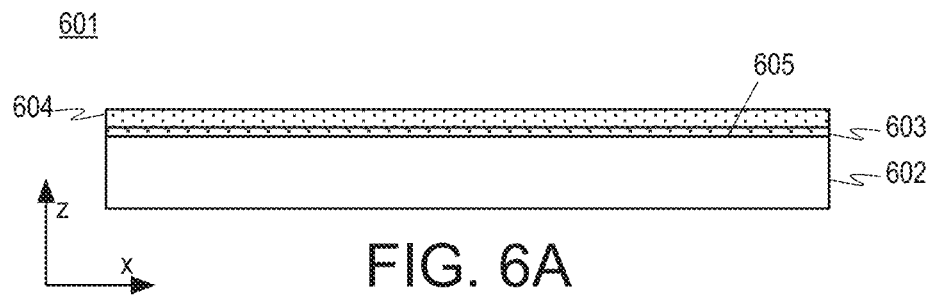

As shown in FIG. 6A, transistor device structure 601 includes a gate dielectric layer sheet 603 formed over a carrier substrate 602 and a transition metal dichalcogenide layer sheet 604 formed over gate dielectric layer sheet 603. Carder substrate 602 may include any suitable carrier substrate for the formation of gate dielectric layer sheet 603 and transition metal dichalcogenide layer sheet 604 and subsequent separation from gate dielectric layer sheet 603. For example, carrier substrate 602 may be a monocrystalline silicon substrate, a silicon on insulator substrate, or the like. In an embodiment, a surface 605 (e.g., a top surface for the formation of gate dielectric layer sheet 603 and transition metal dichalcogenide layer sheet 604) may include a coating or layer that promotes the formation of gate dielectric layer sheet 603 and transition metal dichalcogenide layer sheet 604 and/or promotes the subsequent separation from gate dielectric layer sheet 603. For example, a crystalline III-N layer may be formed on surface 605 (e.g., a boron nitride layer, an aluminum nitride layer, a gallium nitride layer, or an indium nitride layer) may promote the formation of gate dielectric layer sheet 603 and transition metal dichalcogenide layer sheet 604 via lattice matching.

Gate dielectric layer sheet 603 may include any suitable gate dielectric material such as any materials discussed herein with respect to gate dielectric layer 104 or gate dielectric layer 205. In an embodiment, gate dielectric layer sheet 603 is a boron nitride layer. Transition metal dichalcogenide layer sheet 604 may include any number of transition metal dichalcogenide monolayers of any suitable materials as discussed herein and transition metal dichalcogenide layer sheet 604 may be characterized as a transition metal dichalcogenide layers sheet, a sheet of transition metal dichalcogenide layers, or the like. For example, transition metal dichalcogenide layer sheet 503 may include any number of $MoSe_2$ layers, any number of $MoS_2$ layers, any number of $WSe_2$ layers, any number of $WS_2$ layers, or the like. Furthermore, gate dielectric layer sheet 603 and transition metal dichalcogenide layer sheet 604 may be formed using any suitable technique or techniques such as chemical vapor deposition techniques, atomic layer deposition techniques, or the like.

Figure 6B:
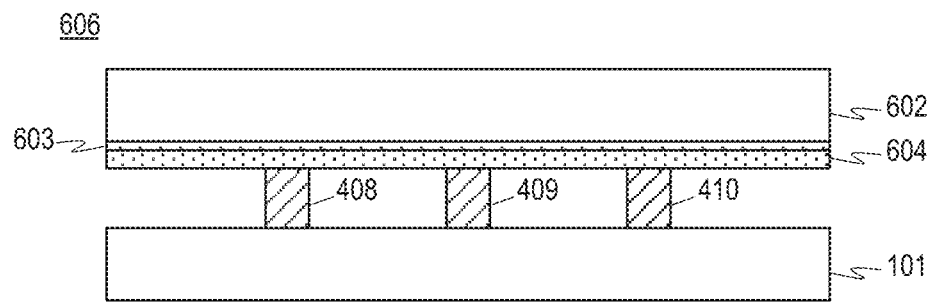

FIG. 6B illustrates a transistor device structure 606 similar to transistor device structure 601, after transistor device structure 601 is flipped and disposed on transistor device structure 407 (please refer to FIG. 4D) such that transition metal dichalcogenide layer sheet 604 contacts non-planar bodies 408, 409, 410. Transition metal dichalcogenide layer sheet 604 may be placed into contact with non-planar bodies 408, 409, 410 using any suitable technique or techniques. For example, one of transistor device structure 601 or transistor device structure 407 may be attached to a chuck (e.g., via vacuum or the like), flipped and placed adjacent to and in contact with the other of transistor device structure 601 and transistor device structure 407, which may also be fixed to a chuck (e.g., via vacuum or the like), such that transition metal dichalcogenide layer sheet 503 contacts non-planar bodies 408, 409, 410.

Figure 6C:
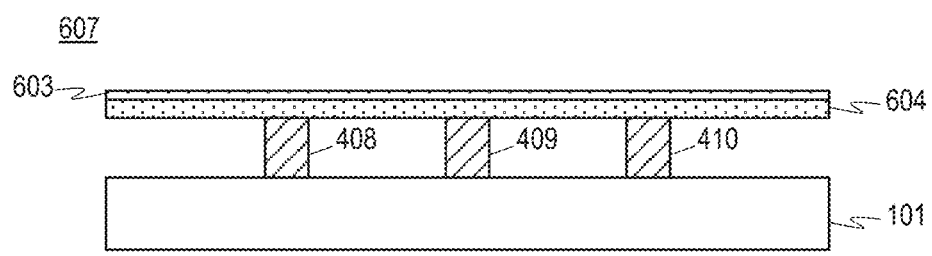

FIG. 6C illustrates a transistor device structure 607 similar to transistor device structure 606, after the separation of carrier substrate 602 from gate dielectric layer sheet 603. Carrier substrate 602 may be separated from gate dielectric layer sheet 603 using any suitable technique or techniques. In an embodiment, carrier substrate 602 and gate dielectric layer sheet 603 are cleaved using laser induced cleaving or the like. In an embodiment, carrier substrate 602 is removed from gate dielectric layer sheet 603 by physical grinding or the like. In an embodiment, carrier substrate 602 includes a silicon oxide layer adjacent to gate dielectric layer sheet 603 and a crystalline silicon layer adjacent to the silicon oxide layer. In such an embodiment, carrier substrate 602 may be removed by cleaving the silicon oxide layer and crystalline silicon interface (leaving the silicon oxide layer on gate dielectric layer sheet 603) and subsequently removing the silicon oxide layer via etch processing.

Figure 6D:
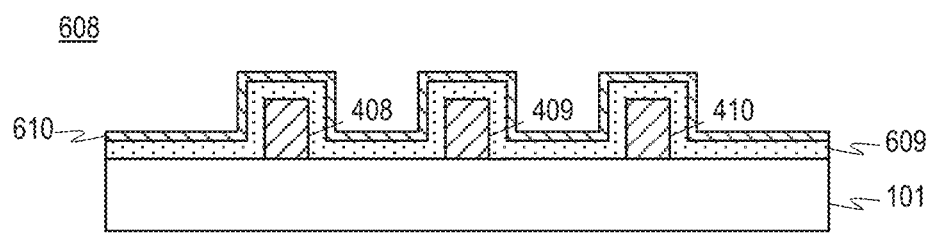

FIG. 6D illustrates a transistor device structure 608 similar to transistor device structure 607, after the annealing of transition metal dichalcogenide layer sheet 604 and gate dielectric layer sheet 603 to form a conformal crystalline transition metal dichalcogenide layer 609 and a conformal gate dielectric layer sheet 610. The annealing to form conformal crystalline transition metal dichalcogenide layer 609 and conformal gate dielectric layer sheet 610 may be performed using any suitable technique or techniques. In an embodiment, the anneal is performed with a maximum anneal temperature in the range of 400° C. to 500° C. In an embodiment, the anneal is performed with a maximum anneal temperature in the range of 500° C. to 600° C. In an embodiment, the anneal is performed with a maximum anneal temperature in the range of 600° C. to 800° C. Furthermore, the anneal may be performed for any suitable duration such as a duration in the range of 1 minute to 5 minutes, 5 minutes to 15 minutes, 15 minutes to 1 hour, or the like.

As shown, conformal crystalline transition metal dichalcogenide layer 609 and conformal gate dielectric layer sheet 610 are conformal to non-planar bodies 408, 409, 410 and exposed portions of lateral surface 118 of substrate 101. Conformal crystalline transition metal dichalcogenide layer 609 may have any characteristics (e.g., materials, number of transition metal dichalcogenide monolayers, thickness, etc.) as discussed herein with respect to transition metal dichalcogenide cladding layers 103, 204, or any other transition metal dichalcogenide cladding layer(s) discussed herein. Conformal gate dielectric layer sheet 610 may have any characteristics (e.g., materials, etc.) as discussed herein with respect to gate dielectric layers 104, 205 or any other gate dielectric layer discussed herein. In some embodiments, the formation of conformal crystalline transition metal dichalcogenide layer 609 and conformal gate dielectric layer sheet 610 may be aided by one or both of gate dielectric layer sheet 603 and transition metal dichalcogenide layer sheet 604 having been compressively strained on carrier substrate 602 such that one or both of gate dielectric layer sheet 603 and transition metal dichalcogenide layer sheet 604 relax during anneal to form conformal crystalline transition metal dichalcogenide layer 609 and conformal gate dielectric layer sheet 610. Furthermore, as discussed with respect to FIGS. 5A-5F, the embodiments of FIGS. 6A-6E may use relatively small non-planar bodies 408, 409, 410 (e.g., having lateral widths and vertical heights not exceeding 15 nanometers) to aid in the formation of conformal crystalline transition metal dichalcogenide layer 609 and conformal gate dielectric layer sheet 610.

Figure 6E:
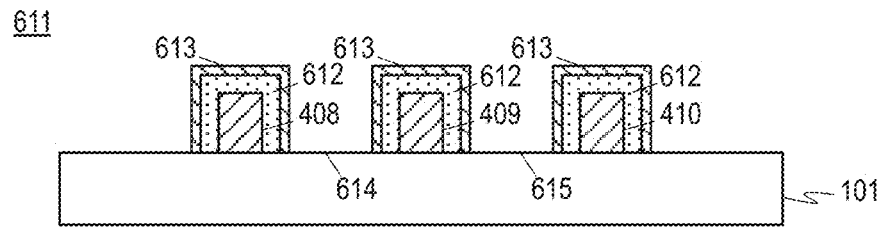

FIG. 6E illustrates a transistor device structure 611 similar to transistor device structure 608, after the formation of transition metal dichalcogenide cladding layers 612 over non-planar bodies 408, 409, 410 and of gate dielectric layer 613 over transition metal dichalcogenide cladding layers 612. Transition metal dichalcogenide cladding layers 612 and gate dielectric layer 613 may be formed using any suitable technique or techniques such as lithography and etch techniques or the like. For example, in analogy to FIG. 5E, transition metal dichalcogenide cladding layers 612 and gate dielectric layer 613 may be patterned from conformal crystalline transition metal dichalcogenide layer 609 and conformal gate dielectric layer sheet 610 using multiple lithography and etch operations (e.g., patterning both conformal crystalline transition metal dichalcogenide layer 609 and conformal gate dielectric layer sheet 610 to provide transition metal dichalcogenide cladding layers 612 and a gate dielectric layer having the same pattern and subsequently pattering the gate dielectric layer to provide gate dielectric layer 613; patterning conformal gate dielectric layer sheet 610 to provide gate dielectric layer 613 and subsequently patterning conformal crystalline transition metal dichalcogenide layer 609 to provide transition metal dichalcogenide cladding layers 612; or the like). As will be appreciated, although having substantially the same pattern in the cross section of FIG. 6E, transition metal dichalcogenide cladding layers 612 and gate dielectric layer 613 have different patterns in transistor device structure 611 (please refer to FIGS. 1A-1C and 2A-2C).

In the illustrated embodiment, separate transition metal dichalcogenide cladding layers 612 and gate dielectric layer 613 both conformal to each of non-planar bodies 408, 409, 410 are provided with no portion of transition metal dichalcogenide cladding layers 612 and gate dielectric layer 613 extending between non-planar bodies 408, 409, 410 (e.g., regions 614, 615 of substrate 101 between sidewalls of gate dielectric layer 613 and between non-planar bodies 408, 409, 410 are exposed). In other embodiments, transition metal dichalcogenide cladding layers 612 and gate dielectric layer 613 may extend over one or both of regions 614, 615 as discussed herein with respect to FIGS. 2A-2C.

Subsequent processing may be performed with respect to transistor device structure 611 to form transistor device structure 100, transistor device structure 200, or the like. For example, a gate stack including a gate dielectric and a gate electrode may be formed over regions (e.g., channel regions) of transition metal dichalcogenide cladding layers 613, source and drain electrodes may be formed over other regions of transition metal dichalcogenide cladding layers 613 (e.g., source and drain regions, respectively), a field dielectric may be provided to electrically isolate such transistor device structure, the transistor device structures may be contacted by metallized contacts, and higher level metallization layers may be formed to provide electrical routing to the transistor device structures as is known in the art.

Figure 7A:
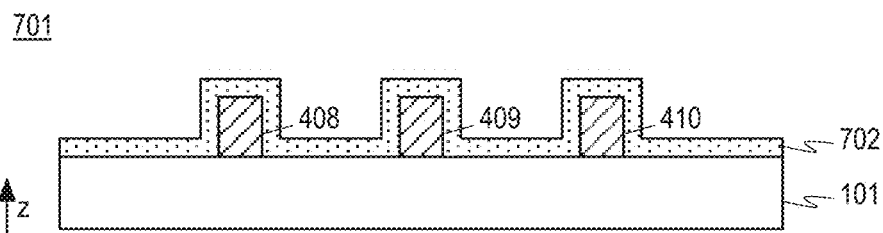
FIGS. 7A, 7B, and 7C are cross-sectional views of example transistor device structures particular fabrication operations are performed.
Figure 7B:
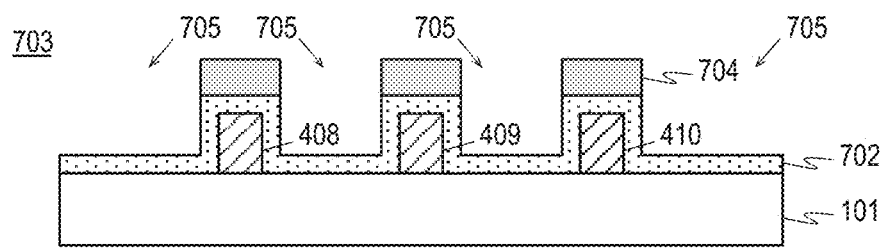
Figure 7C:
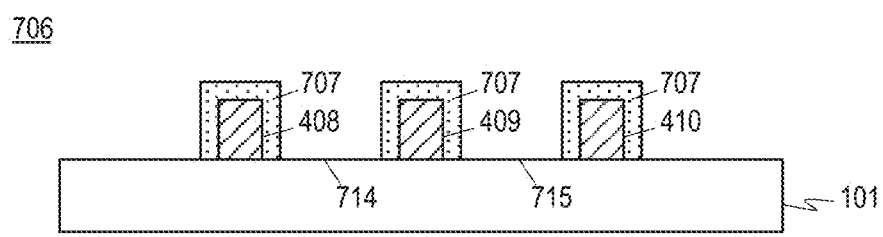

FIGS. 7A, 7B, and 7C are cross-sectional views of example transistor device structures as particular fabrication operations are performed, arranged in accordance with at least some implementations of the present disclosure. FIGS. 7A, 7B, and 7C illustrates side views of transistor device structures along the x-z plane as illustrated and discussed herein.

FIG. 7A illustrates a transistor device structure 701 similar to transistor device structure 407 (please refer to FIG. 4D), after the formation of one or more conformal crystalline transition metal dichalcogenide layers 702 over non-planar bodies 408, 409, 410 and exposed portions of substrate 101. Conformal crystalline transition metal dichalcogenide layers 702 may be disposed or formed over non-planar bodies 408, 409, 410 and exposed portions of substrate 101 using any suitable technique or techniques. In an embodiment, conformal crystalline transition metal dichalcogenide layers 702 are formed using atomic layer deposition. In an embodiment, conformal crystalline transition metal dichalcogenide layers 702 are formed using chemical vapor deposition.

In an embodiment, a conformal layer having the same composition of transition metal atoms and chalcogen atoms as conformal crystalline transition metal dichalcogenide layers 702 is first formed over non-planar bodies 408, 409, 410 and exposed portions of substrate 101 such that the conformal layer is a polycrystalline layer or an amorphous layer. The conformal layer is then annealed to form conformal crystalline transition metal dichalcogenide layers 702. In an embodiment, non-planar bodies 408, 409, 410 include one or more layers of boron nitride (e.g., HBN) to provide a crystallization seed for the crystallization of the polycrystalline amorphous material to form conformal crystalline transition metal dichalcogenide layers 702. For example, the conformal layer having the same composition of transition metal atoms and chalcogen atoms may include transition metal atoms and chalcogen atoms at a ratio of 1:2 for the formation of one or more crystalline transition metal dichalcogenide monolayers as discussed herein.

FIG. 7B illustrates a transistor device structure 703 similar to transistor device structure 701, after the formation of a patterned layer 704 over conformal crystalline transition metal dichalcogenide layer 702. Patterned layer 704 may include any suitable material or materials such as a photoresist and patterned layer 704 may formed using any suitable technique or techniques such as photolithography techniques. As shown, patterned 704 includes openings 705 to transfer a pattern to conformal crystalline transition metal dichalcogenide layer 702 for the formation of (patterned) transition metal dichalcogenide cladding layers as discussed herein.

FIG. 7C illustrates a transistor device structure 706 similar to transistor device structure 703, after the formation of transition metal dichalcogenide cladding layers 707 over non-planar bodies 408, 409, 410. Transition metal dichalcogenide cladding layers 707 may be formed using any suitable technique or techniques such as an anisotropic etch of the exposed portions of conformal crystalline transition metal dichalcogenide layer 702 and a subsequent removal of patterned layer 704.

In the illustrated embodiment, separate transition metal dichalcogenide cladding layers 707 conformal to each of non-planar bodies 408, 409, 410 are provided with no portion of transition metal dichalcogenide cladding layers 707 extending between non-planar bodies 408, 409, 410 (e.g., regions 714, 715 of substrate 101 between sidewalls of transition metal dichalcogenide cladding layers 707 and between non-planar bodies 408, 409, 410 are exposed). In other embodiments, transition metal dichalcogenide cladding layers 707 may extend over one or both of regions 714, 715 as discussed herein with respect to FIGS. 2A-2C.

Subsequent processing may be performed with respect to transistor device structure 706 to form transistor device structure 100, transistor device structure 200, or the like. For example, a gate stack including a gate dielectric and a gate electrode may be formed over regions (e.g., channel regions) of transition metal dichalcogenide cladding layers 707, source and drain electrodes may be formed over other regions of transition metal dichalcogenide cladding layers 707 (e.g., source and drain regions, respectively), a field dielectric may be provided to electrically isolate such transistor device structure, the transistor device structures may be contacted by metallized contacts, and higher level metallization layers may be formed to provide electrical routing to the transistor device structures as is known in the art.

Figure 8:
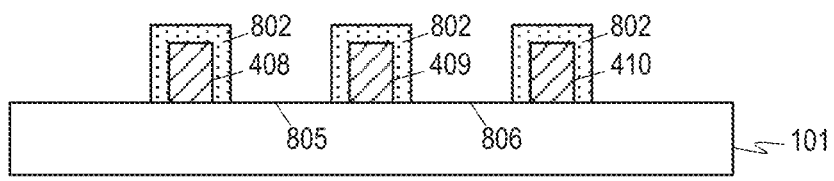
FIG. 8 is a cross-sectional view of an example transistor device structure as particular fabrication operations are performed.

FIG. 8 is a cross-sectional view of an example transistor device structure as particular fabrication operations are performed, arranged in accordance with at least some implementations of the present disclosure. FIG. 8 illustrates a side view of a transistor device structure along the x-z plane as illustrated and discussed herein.

FIG. 8 illustrates a transistor device structure 801 similar to transistor device structure 407 (please refer to FIG. 4D), after the formation of one or more transition metal dichalcogenide cladding layers 802 over non-planar bodies 408, 409, 410 while leaving portions or regions of substrate 101 such as regions 805, 806 exposed. Transition metal dichalcogenide cladding layers 802 may be disposed or formed over non-planar bodies 408, 409, 410 while leaving regions 805, 806 exposed using any suitable technique or techniques. In an embodiment, non-planar bodies 408, 409, 410 and substrate 101 (e.g., the layer or portion or the like of substrate 101 adjacent to and/or in contact with non-planar bodies 408, 409, 410) may have different compositions such that transition metal dichalcogenide cladding layers 802 are selectively formed over non-planar bodies 408, 409, 410 (and not on exposed regions 805, 806) due to the composition difference.

In an embodiment, non-planar bodies 408, 409, 410 are silicon oxide or doped silicon oxide, the layer or portion of substrate 101 adjacent to non-planar bodies 408, 409, 410 is silicon nitride or doped silicon nitride, and the selective formation of transition metal dichalcogenide cladding layers 802 includes chemical vapor deposition of transition metal dichalcogenide cladding layers 802 or atomic layer deposition of transition metal dichalcogenide cladding layers 802. In an embodiment, non-planar bodies 408, 409, 410 are silicon nitride or doped silicon nitride, the layer or portion of substrate 101 adjacent to non-planar bodies 408, 409, 410 is silicon oxide or doped silicon oxide, and the selective formation of transition metal dichalcogenide cladding layers 802 includes chemical vapor deposition of transition metal dichalcogenide cladding layers 802 or atomic layer deposition of transition metal dichalcogenide cladding layers 802.

In an embodiment, non-planar bodies 408, 409, 410 include layers of boron nitride (e.g., crystalline boron nitride) and the layer or portion of substrate 101 adjacent to non-planar bodies 408, 409, 410 is an amorphous dielectric material such as silicon oxide or doped silicon oxide, silicon nitride or doped silicon nitride, or the like, and the selective formation of transition metal dichalcogenide cladding layers 802 includes selective epitaxial growth of a first crystalline chalcogenide layer over the boron nitride, selective epitaxial growth of a crystalline transition metal layer over the first crystalline chalcogenide layer, and selective epitaxial growth of a second crystalline chalcogenide layer over the crystalline transition metal layer to form a transition metal dichalcogenide monolayer. Such processing (e.g., selective epitaxial growth of a first crystalline chalcogenide layer, selective epitaxial growth of a crystalline transition metal layer, and selective epitaxial growth of a second crystalline chalcogenide layer) may be repeated any number of times for any number of transition metal dichalcogenide monolayers. For example, in such processing, the crystalline boron nitride of non-planar bodies 408, 409, 410 may provide a seed location for the growth of the first crystalline chalcogenide layer, which may provide a seed location for the growth of the crystalline transition metal layer, which may provide a seed location for the growth of the second crystalline chalcogenide layer, and so on.

Subsequent processing may be performed with respect to transistor device structure 801 to form transistor device structure 100, or the like. For example, a gate stack including a gate dielectric and a gate electrode may be formed over regions (e.g., channel regions) of transition metal dichalcogenide cladding layers 802, source and drain electrodes may be formed over other regions of transition metal dichalcogenide cladding layers 802 (e.g., source and drain regions, respectively), a field dielectric may be provided to electrically isolate such transistor device structure, the transistor device structures may be contacted by metallized contacts, and higher level metallization layers may be formed to provide electrical routing to the transistor device structures as is known in the art.

The transistor device structures discussed herein may be included in any suitable devices (e.g., processors, memory devices, or the like), which may be, in turn implemented in any suitable form factor system or device.

Figure 9:
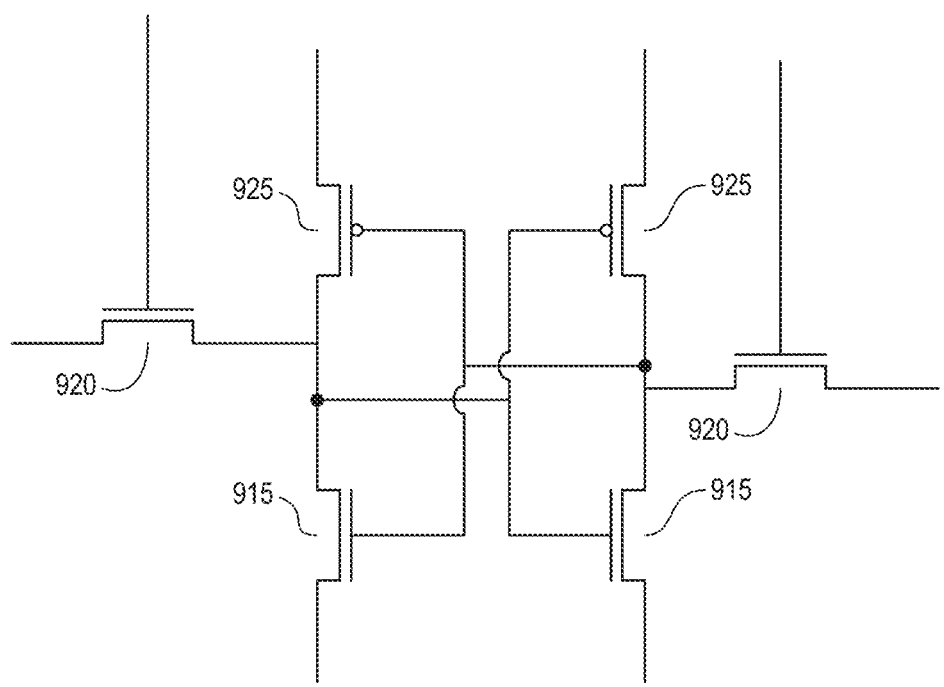
FIG. 9 illustrates an example SRAM cell implementing one or more transistors having one or more non-planar transition metal dichalcogenide cladding layers.

FIG. 9 illustrates an example SRAM cell 900 implementing one or more transistors having one or more non-planar transition metal dichalcogenide cladding layers, arranged in accordance with at least some implementations of the present disclosure. FIG. 9 illustrates an example 6 transistor (6T) SRAM cell 900 including access transistors 920, pull-down transistors 915, and pull-up transistors 925. In various examples, one or more of access transistors 920, pull-down transistors 915, and pull-up transistors 925 may be implemented as transistor device structure 100 and/or 200. A complete SRAM memory circuit may be formed by interconnecting many SRAM cells such as SRAM cell 900.

In an embodiment, one or more of access transistors 920 and pull-down transistors 915 are n-type transistors including features discussed with respect to n-type transistor device structures discussed herein (e.g., having one or more non-planar $WSe_2$ layers) and pull-up transistors 925 are p-type transistors including features discussed with respect to p-type transistor device structures discussed herein (e.g., having one or more non-planar $MoS_2$ layers). In an embodiment, access transistors 920 and pull-down transistors 915 each include one or more transition metal dichalcogenide cladding layers 103 over non-planar body 102 such that the one or more transition metal dichalcogenide cladding layers include one or more $WSe_2$ monolayers. In an embodiment, access transistors 920 and pull-down transistors 915 each include one or more transition metal dichalcogenide cladding layers 204 over non-planar body 201, 202, 203 such that the one or more transition metal dichalcogenide cladding layers include one or more $WSe_2$ monolayers. In an embodiment, pull-up transistors 925 each include one or more transition metal dichalcogenide cladding layers 103 over non-planar body 102 such that the one or more transition metal dichalcogenide cladding layers include one or more $MoS_2$ monolayers. In an embodiment, pull-up transistors 925 each include one or more transition metal dichalcogenide cladding layers 204 over non-planar body 201, 202, 203 such that the one or more transition metal dichalcogenide cladding layers include one or more $MoS_2$ monolayers.

Figure 10:
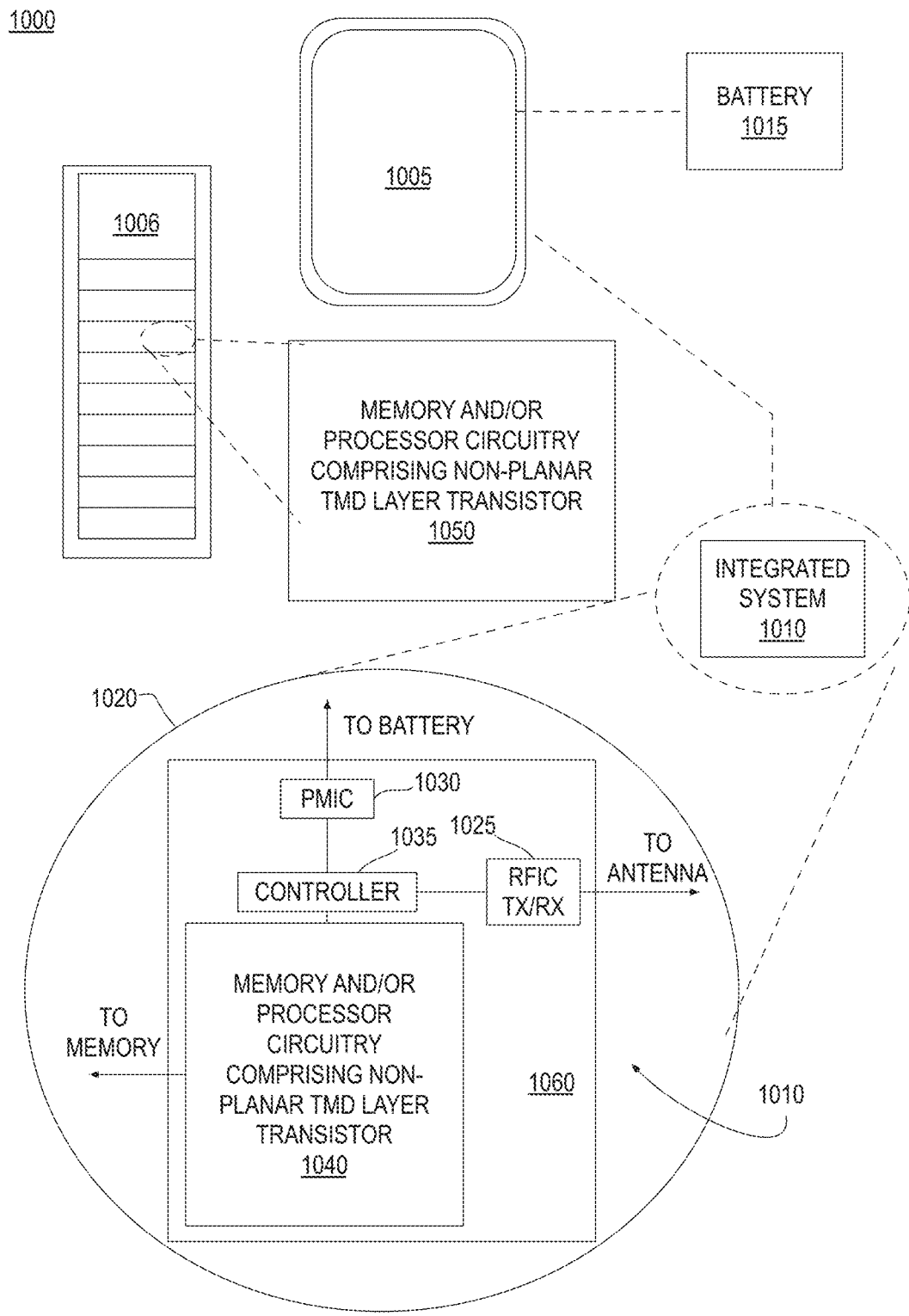
FIG. 10 illustrates a system in which a mobile computing platform and/or a data server machine employs a transistor having one or more non-planar transition metal dichalcogenide cladding layers.

FIG. 10 illustrates a system 1000 in which a mobile computing platform 1005 and/or a data server machine 1006 employs a transistor having one or more non-planar transition metal dichalcogenide cladding layers, arranged in accordance with at least some implementations of the present disclosure. Data server machine 1006 may be any commercial server, for example, including any number of high-performance computing platforms disposed within a rack and networked together for electronic data processing, which in the exemplary embodiment includes a packaged device 1050. For example, device 1050 (e.g., a memory or processor) may include a transistor having one or more non-planar transition metal dichalcogenide cladding layers. In an embodiment, device 1050 includes a processor including a transistor having one or more non-planar transition metal dichalcogenide cladding layers such as any transistor device structure discussed herein. As discussed below, in some examples, device 1050 may include a system on a chip (SOC) such as SOC 1060, which is illustrated with respect to mobile computing platform 1005.

Mobile computing platform 1005 may be any portable device configured for each of electronic data display, electronic data processing, wireless electronic data transmission, or the like. For example, mobile computing platform 1005 may be any of a tablet, a smart phone, a laptop computer, etc., and may include a display screen (e.g., a capacitive, inductive, resistive, or optical touchscreen), a chip-level or package-level integrated system 1010, and a battery 1015. Although illustrated with respect to mobile computing platform 1005, in other examples, chip-level or package-level integrated system 1010 and a battery 1015 may be implemented in a desktop computing platform, an automotive computing platform, an internet of things platform, or the like.

Whether disposed within integrated system 1010 illustrated in expanded view 1020 or as a stand-alone packaged device within data server machine 1006, SOC 1060 may include memory circuitry and/or processor circuitry 1040 (e.g., RAM, a microprocessor, a multi-core microprocessor, graphics processor, etc.), a PMIC 1030, a controller 1035, and a radio frequency integrated circuit (RFIC) 1025 (e.g., including a wideband RF transmitter and/or receiver (TX/RX)). As shown, one or more transistor devices having one or more non-planar transition metal dichalcogenide cladding layers such as any transistor device structure discussed herein may be employed via memory circuitry and/or processor circuitry 1040. In some embodiments, RFIC 1025 includes a digital baseband and an analog front end module further comprising a power amplifier on a transmit path and a low noise amplifier on a receive path). Functionally, PMIC 1030 may perform battery power regulation, DC-to-DC conversion, etc., and so has an input coupled to battery 1015, and an output providing a current supply to other functional modules. As further illustrated in FIG. 10, in the exemplary embodiment, RFIC 1025 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Memory circuitry and/or processor circuitry 1040 may provide memory functionality for SOC 1060, high level control, data processing and the like for SOC 1060. In alternative implementations, each of the SOC modules may be integrated onto separate ICs coupled to a package substrate, interposer, or board.

Figure 11:
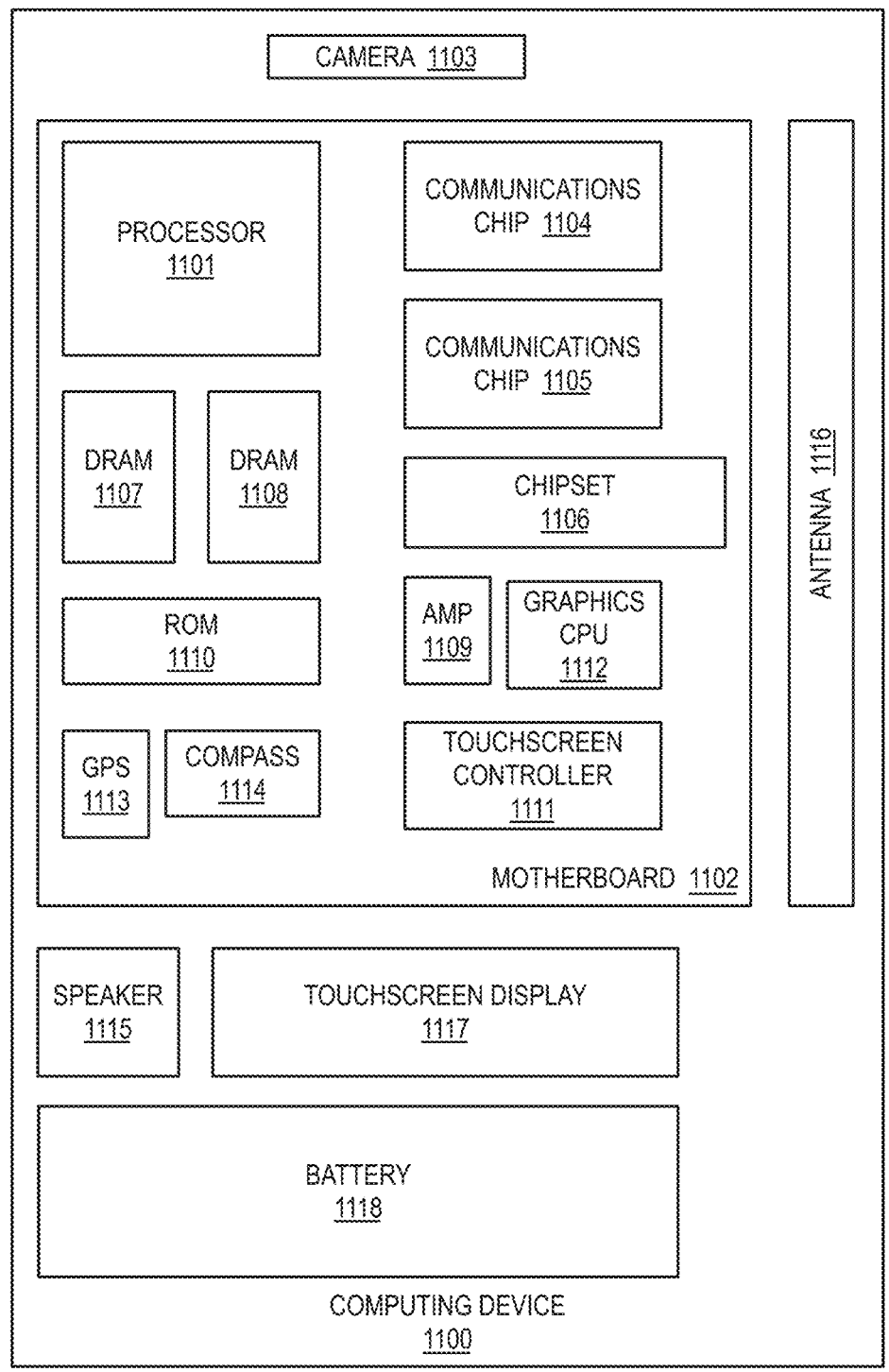
FIG. 11 is a functional block diagram of a computing device, all arranged in accordance with at least some implementations of the present disclosure.

FIG. 11 is a functional block diagram of a computing device 1100, arranged in accordance with at least some implementations of the present disclosure. Computing device 1100 or portions thereof may be implemented via one or both of data server machine 1006 or mobile computing platform 1005, for example, and further includes a motherboard 1102 hosting a number of components, such as but not limited to a processor 1101 (e.g., an applications processor) and one or more communications chips 1104, 1105. Processor 1101 may be physically and/or electrically coupled to motherboard 1102. In some examples, processor 1101 includes an integrated circuit die packaged within the processor 1101. In general, the term "processor" may refer to any device or portion of a device that processes electronic data from registers and/or memory to transform that electronic data into other electronic data that may be stored in registers and/or memory.

In various examples, one or more communication chips 1104, 1105 may also be physically and/or electrically coupled to the motherboard 1102. In further implementations, communication chips 1104 may be part of processor 1101. Depending on its applications, computing device 1100 may include other components that may or may not be physically and electrically coupled to motherboard 1102. These other components may include, but are not limited to, volatile memory (e.g., DRAM) 1107, 1108, non-volatile memory (e.g., ROM) 1110, a graphics processor 1112, flash memory, global positioning system (GPS) device 1113, compass 1114, a chipset 1106, an antenna 1116, a power amplifier 1109, a touchscreen controller 1111, a touchscreen display 1117, a speaker 1115, a camera 1103, and a battery 1118, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 1104, 1105 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1104, 1105 may implement any of a number of wireless standards or protocols, including but not limited to those described elsewhere herein. As discussed, computing device 1100 may include a plurality of communication chips 1104, 1105. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. For example, any component of computing device 1100 may include or utilize one or more transistors having one or more non-planar transition metal dichalcogenide cladding layers such as any transistor device structure(s) discussed herein. In an embodiment, processor 1101 of computing device 1100 includes one or more transistors having one or more non-planar transition metal dichalcogenide cladding layers such as any transistor device structure(s) discussed herein.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to further embodiments.

In one or more first embodiments, a transistor comprises one or more transition metal dichalcogenide cladding layers over a non-planar body having a top surface and a sidewall surface, wherein the transition metal dichalcogenide cladding layers are over and substantially conformal to the top surface and the sidewall surface of the non-planar body, a source electrode and a drain electrode coupled to a first and a second region of the transition metal dichalcogenide cladding layers, respectively, and a gate electrode between the source electrode and the drain electrode and coupled to a third region of the transition metal dichalcogenide cladding layers.

In one or more second embodiments, for any of the first embodiments, the non-planar body comprises one or more layers of boron nitride.

In one or more third embodiments, for any of the first or second embodiments, the non-planar body comprises one or more layers of boron nitride and the non-planar body is on a substrate comprising an amorphous dielectric adjacent to the non-planar body.

In one or more fourth embodiments, for any of the first through third embodiments, the non-planar body comprises one or more layers of boron, the non-planar body is on a substrate comprising an amorphous dielectric adjacent to the non-planar body, and the amorphous dielectric comprises silicon oxide.

In one or more fifth embodiments, for any of the first through fourth embodiments, the non-planar body comprises one or more layers of boron nitride and/or the non-planar body is on a substrate comprising an amorphous dielectric adjacent to the non-planar body.

In one or more sixth embodiments, for any of the first through fifth embodiments, the transistor further comprises a substrate such that the non-planar body is on the substrate and a second non-planar body having a second top surface and a second sidewall surface on the substrate and separated from the non-planar body by a region of the substrate such that the one or more transition metal dichalcogenide cladding layers are over and substantially conformal to the top surface and the second sidewall surface of the second non-planar body and the region of the substrate.

In one or more seventh embodiments, for any of the first through sixth embodiments, each of the transition metal dichalcogenide cladding layers comprises a transition metal layer between two chalcogen layers.

In one or more eighth embodiments, for any of the first through seventh embodiments, each of the transition metal dichalcogenide cladding layers comprises a transition metal layer between two chalcogen layers and the transition metal layer comprises one or more of tungsten or molybdenum and the two chalcogen layers comprise one or more of sulfur, selenium, or tellurium.

In one or more ninth embodiments, for any of the first through eighth embodiments, each of the transition metal dichalcogenide cladding layers comprises a transition metal layer between two chalcogen layers, the transition metal layer comprises one or more of tungsten or molybdenum, and the two chalcogen layers comprise one or more of sulfur, selenium, or tellurium.

In one or more tenth embodiments, for any of the first through ninth embodiments, the top surface of the non-planar body is substantially perpendicular with respect to the sidewall surface.

In one or more eleventh embodiments, for any of the first through tenth embodiments, the non-planar body comprises one of silicon oxide or silicon nitride.

In one or more twelfth embodiments, for any of the first through eleventh embodiments, the transition metal dichalcogenide cladding layers comprise not less than five transition metal dichalcogenide layers each comprising a transition metal layer between two chalcogen layers.

In one or more thirteenth embodiments, for any of the first through twelfth embodiments, the transistor further comprises a gate dielectric layer between the gate electrode and the third region of the transition metal dichalcogenide cladding layers such that the transition metal dichalcogenide cladding layers comprise at least a transition metal layer between two chalcogen layers and the gate dielectric layer comprises boron nitride.

In one or more fourteenth embodiments, a system includes a memory and a processor coupled to the memory, the processor including a transistor according to any of the first through thirteenth embodiments.

In one or more fifteenth embodiments, for any of the fourteenth embodiments, the system further includes an antenna coupled to the processor and a battery coupled to the processor.

In one or more sixteenth embodiments, a system includes a means for storing data and a means for processing the stored data coupled to the means for storing data, the means for processing including a transistor according to any of the first through thirteenth embodiments.

In one or more seventeenth embodiments, for any of the sixteenth embodiments, the system further includes a means for transmitting wireless data coupled to the means for processing.

In one or more eighteenth embodiments, a system comprises a memory and a processor coupled to the memory, the processor including a transistor comprising one or more transition metal dichalcogenide cladding layers over a non-planar body having a top surface and a sidewall surface such that the transition metal dichalcogenide cladding layers are over and substantially conformal to the top surface and the sidewall surface of the non-planar body, a source electrode and a drain electrode coupled to a first and a second region of the transition metal dichalcogenide cladding layers, respectively, and a gate electrode between the source electrode and the drain electrode and coupled to a third region of the transition metal dichalcogenide cladding layers.

In one or more nineteenth embodiments, for any of the eighteenth embodiments, the non-planar body comprises one or more layers of boron nitride and the non-planar body is on a substrate comprising an amorphous dielectric adjacent to the non-planar body.

In one or more twentieth embodiments, for any of the eighteenth or nineteenth embodiments, the transistor further comprises a substrate such that the non-planar body is on the substrate and a second non-planar body having a second top surface and a second sidewall surface on the substrate and separated from the non-planar body by a region of the substrate such that the one or more transition metal dichalcogenide cladding layers are over and substantially conformal to the top surface and the second sidewall surface of the second non-planar body and the region of the substrate.

In one or more twenty-first embodiments, for any of the eighteenth through twentieth embodiments, each of the transition metal dichalcogenide cladding layers comprises a transition metal layer between two chalcogen layers and the transition metal layer comprises one or more of tungsten or molybdenum and the two chalcogen layers comprise one or more of sulfur, selenium, or tellurium.

In one or more twenty-second embodiments, for any of the eighteenth through twenty-first embodiments, the top surface of the non-planar body is substantially perpendicular with respect to the sidewall surface.

In one or more twenty-third embodiments, for any of the eighteenth through twenty-second embodiments, the transition metal dichalcogenide cladding layers comprise not less than five transition metal dichalcogenide layers each comprising a transition metal layer between two chalcogen layers.

In one or more twenty-fourth embodiments, method for fabricating a transistor comprises forming a non-planar body over a substrate, the non-planar body having a top surface and a sidewall surface, disposing one or more transition metal dichalcogenide cladding layers over the non-planar body such that the transition metal dichalcogenide cladding layers are over and substantially conformal to the top surface and the sidewall surface of the non-planar body, forming a gate electrode coupled to a first region of the transition metal dichalcogenide cladding layers, and forming a source electrode and a drain electrode coupled to a second and a third region of the transition metal dichalcogenide cladding layers, respectively.

In one or more twenty-fifth embodiments, for any of twenty-fourth embodiments, the non-planar body comprises a first composition different than a second composition of a portion of the substrate adjacent to the non-planar body and disposing the transition metal dichalcogenide cladding layers over the non-planar body comprises selectively forming the transition metal dichalcogenide cladding layers over the non-planar body while leaving the portion of the substrate exposed.

In one or more twenty-sixth embodiments, for any of the twenty-fourth or twenty-fifth embodiments, the non-planar body comprises a first composition different than a second composition of a portion of the substrate adjacent to the non-planar body and disposing the transition metal dichalcogenide cladding layers over the non-planar body comprises selectively forming the transition metal dichalcogenide cladding layers over the non-planar body while leaving the portion of the substrate exposed, such that the non-planar body comprises one or more layers of crystalline boron nitride, the substrate comprises an amorphous dielectric material, and selectively forming the transition metal dichalcogenide cladding layers comprises a first selective epitaxial growth of a first crystalline chalcogenide layer over the crystalline boron nitride, a second selective epitaxial growth of a crystalline transition metal layer over the first crystalline chalcogenide layer, and a third selective epitaxial growth of a second crystalline chalcogenide layer over the crystalline transition metal layer.

In one or more twenty-seventh embodiments, for any of the twenty-fourth through twenty-sixth embodiments, the non-planar body comprises a first composition different than a second composition of a portion of the substrate adjacent to the non-planar body and disposing the transition metal dichalcogenide cladding layers over the non-planar body comprises selectively forming the transition metal dichalcogenide cladding layers over the non-planar body while leaving the portion of the substrate exposed, such that the non-planar body comprises one or more layers of crystalline boron nitride, the substrate comprises an amorphous dielectric material, and selectively forming the transition metal dichalcogenide cladding layers comprises a first selective epitaxial growth of a first crystalline chalcogenide layer over the crystalline boron nitride, a second selective epitaxial growth of a crystalline transition metal layer over the first crystalline chalcogenide layer, and a third selective epitaxial growth of a second crystalline chalcogenide layer over the crystalline transition metal layer, such that the substrate comprises silicon oxide.

In one or more twenty-eighth embodiments, for any of the twenty-fourth through twenty-seventh embodiments, disposing the transition metal di chalcogenide cladding layers over the non-planar body comprises disposing one or more conformal crystalline transition metal dichalcogenide layers over the non-planar body and the substrate and patterning the conformal crystalline transition metal dichalcogenide layers to remove at least a portion of the conformal crystalline transition metal dichalcogenide layers over the substrate to form the transition metal dichalcogenide cladding layers.

In one or more twenty-ninth embodiments, for any of the twenty-fourth through twenty-eighth embodiments, disposing the transition metal dichalcogenide cladding layers over the non-planar body comprises disposing one or more conformal crystalline transition metal dichalcogenide layers over the non-planar body and the substrate and patterning the conformal crystalline transition metal dichalcogenide layers to remove at least a portion of the conformal crystalline transition metal dichalcogenide layers over the substrate to form the transition metal dichalcogenide cladding layers such that disposing the one or more conformal crystalline transition metal dichalcogenide layers over the non-planar body and the substrate comprises depositing a conformal layer over the non-planar body and the substrate, the conformal layer comprising the same composition of transition metal atoms and chalcogen atoms as the transition metal dichalcogenide cladding layers and annealing the conformal layer to form the conformal crystalline transition metal dichalcogenide layer such that the conformal layer comprises a polycrystalline or amorphous conformal layer.

In one or more thirtieth embodiments, for any of the twenty-fourth through twenty-ninth embodiments, disposing the transition metal dichalcogenide cladding layers over the non-planar body comprises forming a transition metal dichalcogenide layer sheet on a second substrate, contacting the transition metal dichalcogenide layer sheet with the non-planar body over the substrate, separating the second substrate from the transition metal dichalcogenide layer sheet, annealing the transition metal dichalcogenide layer sheet to the non-planar body, and patterning the annealed transition metal dichalcogenide layer sheet to form the transition metal dichalcogenide cladding layers.

In one or more thirty-first embodiments, for any of the twenty-fourth through thirtieth embodiments, disposing the transition metal dichalcogenide cladding layers over the non-planar body comprises forming a boron nitride sheet on a second substrate, forming a transition metal dichalcogenide layer sheet on the boron nitride sheet, contacting the transition metal dichalcogenide layer sheet with the non-planar body over the substrate, separating the second substrate from the boron nitride sheet, annealing the transition metal dichalcogenide layer sheet and the boron nitride sheet to the non-planar body, and patterning the annealed transition metal dichalcogenide layer sheet and the boron nitride sheet to form the transition metal dichalcogenide cladding layers and a gate dielectric layer.

In one or more thirty-second embodiments, a system comprises a means for storing data and a means for processing the stored data, the means for processing comprising one or more transition metal dichalcogenide cladding layers over a non-planar body having a top surface and a sidewall surface such that the transition metal dichalcogenide cladding layers are over and substantially conformal to the top surface and the sidewall surface of the non-planar body, a source electrode and a drain electrode coupled to a first and a second region of the transition metal dichalcogenide cladding layers, respectively, and a gate electrode between the source electrode and the drain electrode and coupled to a third region of the transition metal dichalcogenide cladding layers.

In one or more thirty-third embodiments, for any of thirty-second embodiments, each of the transition metal dichalcogenide cladding layers comprises a transition metal layer between two chalcogen layers, the transition metal layer comprises one or more of tungsten or molybdenum and the two chalcogen layers comprise one or more of sulfur, selenium, or tellurium.

In one or more thirty-fourth embodiments, for any of the thirty-second or thirty-third embodiments, the non-planar body comprises a one or more layers of boron nitride and the non-planar body is on a substrate comprising an amorphous dielectric adjacent to the non-planar body.

In one or more thirty-fifth embodiments, for any of the thirty-second through twenty-fourth embodiments, the system further comprises a substrate such that the non-planar body is on the substrate and a second non-planar body having a second top surface and a second sidewall surface on the substrate and separated from the non-planar body by a region of the substrate such that the one or more transition metal dichalcogenide cladding layers are over and substantially conformal to the top surface and the second sidewall surface of the second non-planar body and the region of the substrate.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

We claim:

1. A transistor comprising:
   a non-planar body on a substrate, the non-planar body comprising a top surface and a sidewall surface;
   one or more transition metal dichalcogenide cladding layers over the non-planar body, wherein the one or more transition metal dichalcogenide cladding layers are over and substantially conformal to the top surface and the sidewall surface of the non-planar body and wherein the one or more transition metal dichalcogenide cladding layers extend beyond the sidewall and over a lateral surface of the substrate by not more than a thickness of the one or more transition metal dichalcogenide cladding layers;
   a source electrode and a drain electrode coupled to a first and a second region of the transition metal dichalcogenide cladding layers, respectively; and
   a gate electrode between the source electrode and the drain electrode and coupled to a third region of the transition metal dichalcogenide cladding layers.

2. The transistor of claim 1, wherein the non-planar body comprises one or more layers of boron nitride.

3. The transistor of claim 2, wherein the substrate comprises an amorphous dielectric adjacent to the non-planar body.

4. The transistor of claim 1, further comprising a gap between an end of the one or more transition metal dichalcogenide cladding layers and the lateral surface at a base of the sidewall surface.

5. The transistor of claim 1, further comprising:
   a second non-planar body having a second top surface and a second sidewall surface over the substrate and separated from the non-planar body by a region of the substrate, wherein the one or more transition metal dichalcogenide cladding layers are over and substantially conformal to the top surface and the second sidewall surface of the second non-planar body and the region of the substrate.

6. The transistor of claim 1, wherein each of the transition metal dichalcogenide cladding layers comprises a transition metal layer between two chalcogen layers.

7. The transistor of claim 6, wherein the transition metal layer comprises one or more of tungsten or molybdenum and the two chalcogen layers comprise one or more of sulfur, selenium, or tellurium.

8. The transistor of claim 1, wherein the top surface of the non-planar body is substantially perpendicular with respect to the sidewall surface.

9. The transistor of claim 1, wherein the non-planar body comprises one of silicon oxide or silicon nitride.

10. The transistor of claim 1, wherein the transition metal dichalcogenide cladding layers comprise not fewer than five transition metal dichalcogenide layers each comprising a transition metal layer between two chalcogen layers.

11. The transistor or claim 1, further comprising:
    a gate dielectric layer between the gate electrode and the third region of the transition metal dichalcogenide cladding layers, wherein the transition metal dichalcogenide cladding layers comprise at least a transition metal layer between two chalcogen layers and the gate dielectric layer comprises boron nitride.

12. A system comprising:
    a memory; and
    a processor coupled to the memory, the processor comprising the transistor of claim 1.

13. A method for fabricating a transistor comprising:
    forming a non-planar body over a substrate, the non-planar body having a top surface and a sidewall surface;
    disposing one or more transition metal dichalcogenide cladding layers over the non-planar body by forming a boron nitride sheet on a second substrate, forming a transition metal dichalcogenide layer sheet on the boron nitride sheet, contacting the transition metal dichalcogenide layer sheet with the non-planar body over the substrate, separating the second substrate from the boron nitride sheet, annealing the transition metal dichalcogenide layer sheet and the boron nitride sheet to the non-planar body, and patterning the annealed transition metal dichalcogenide layer sheet and the boron nitride sheet to form the one or more transition metal dichalcogenide cladding layers and a gate dielectric, wherein the one or more transition metal dichalcogenide cladding layers are over and substantially conformal to the top surface and the sidewall surface of the non-planar body;

forming a gate electrode coupled to a first region of the transition metal dichalcogenide cladding layers; and forming a source electrode and a drain electrode coupled to a second and a third region of the transition metal dichalcogenide cladding layers, respectively.

14. The method of claim 13, wherein the non-planar body comprises a first composition different than a second composition of a portion of the substrate adjacent to the non-planar body.

15. The method of claim 14, wherein the non-planar body comprises one or more layers of crystalline boron nitride and the substrate comprises an amorphous dielectric material.

16. The method of claim 15, wherein the substrate comprises silicon oxide.

17. The method of claim 13, wherein the transition metal dichalcogenide layer sheet comprises one or more of tungsten or molybdenum and one or more of sulfur, selenium, or tellurium.

18. The method of claim 17, wherein separating the second substrate from the boron nitride sheet comprises one of a cleaving or a grind operation.

19. A method for fabricating a transistor comprising:
forming a non-planar body over a substrate, the non-planar body having a top surface and a sidewall surface;

disposing one or more transition metal dichalcogenide cladding layers over the non-planar body by forming a transition metal dichalcogenide layer sheet on a second substrate, contacting the transition metal dichalcogenide layer sheet with the non-planar body over the substrate, separating at least a portion of the second substrate from the transition metal dichalcogenide layer sheet via one of a cleaving or a grind operation, annealing the transition metal dichalcogenide layer sheet to the non-planar body, and patterning the annealed transition metal dichalcogenide layer sheet to form the one or more transition metal dichalcogenide cladding layers, wherein the one or more transition metal dichalcogenide cladding layers are over and substantially conformal to the top surface and the sidewall surface of the non-planar body;

forming a gate electrode coupled to a first region of the transition metal dichalcogenide cladding layers; and forming a source electrode and a drain electrode coupled to a second and a third region of the transition metal dichalcogenide cladding layers, respectively.

20. The method of claim 19, wherein the transition metal dichalcogenide layer sheet comprises one or more of tungsten or molybdenum and one or more of sulfur, selenium, or tellurium.

21. The method of claim 19, wherein the transition metal dichalcogenide layer sheet is formed on a III-N layer of the second substrate.

22. The method of claim 19, wherein the III-N layer comprises one of boron, aluminum, gallium, or indium.

23. The method of claim 19, wherein the transition metal dichalcogenide layer sheet is formed over a silicon oxide layer of the second substrate, the silicon oxide layer on a crystalline silicon layer of the substrate, and wherein said separating comprises separation of the silicon oxide layer from the crystalline silicon layer.

24. The method of claim 19, wherein the transition metal dichalcogenide layer sheet is formed on a dielectric layer of the second substrate, said separating comprises separation of the dielectric layer from a remainder of the second substrate, and wherein at least a portion of the dielectric layer comprises a gate dielectric.

25. The method of claim 24, wherein the dielectric layer comprises at least one of boron and nitrogen, hafnium and oxygen, aluminum and oxygen, or silicon and nitrogen.

* * * * *